US006717488B2

(12) United States Patent
Potter

(10) Patent No.: US 6,717,488 B2
(45) Date of Patent: Apr. 6, 2004

(54) RESONATOR WITH A MEMBER HAVING AN EMBEDDED CHARGE AND A METHOD OF MAKING THEREOF

(75) Inventor: Michael D. Potter, Churchville, NY (US)

(73) Assignee: Nth Tech Corporation, Churchville, NY (US)

( * ) Notice: Subject to any disclaimer, the term of this patent is extended or adjusted under 35 U.S.C. 154(b) by 0 days.

(21) Appl. No.: 10/238,438

(22) Filed: Sep. 9, 2002

(65) Prior Publication Data

US 2003/0112096 A1 Jun. 19, 2003

Related U.S. Application Data

(60) Provisional application No. 60/318,914, filed on Sep. 13, 2001.

(51) Int. Cl.[7] .................... H03H 9/24; H03H 9/125; H03H 9/46; H03H 3/007; H03H 9/52
(52) U.S. Cl. ................. 333/186; 333/197; 29/592.1; 29/886
(58) Field of Search ................. 333/186, 197; 29/592.1, 886; 438/50

(56) References Cited

U.S. PATENT DOCUMENTS

| 3,715,500 | A | 2/1973 | Sessler et al. ............. 381/191 |
| 5,491,604 | A | 2/1996 | Nguyen et al. ............ 361/278 |
| 5,640,133 | A | 6/1997 | MacDonald et al. ....... 333/197 |
| 5,668,303 | A | 9/1997 | Giesler et al. ............ 73/24.06 |
| 5,839,062 | A | 11/1998 | Nguyen et al. ............ 455/323 |
| 5,914,553 | A | 6/1999 | Adams et al. ............. 310/309 |
| 5,919,364 | A | 7/1999 | Lebouitz et al. ....... 210/321.84 |
| 5,955,932 | A | 9/1999 | Nguyen et al. ............ 333/186 |
| 5,994,982 | A | 11/1999 | Kintis et al. .............. 333/235 |
| 6,204,737 | B1 | 3/2001 | Ellä ........................ 333/187 |
| 6,238,946 | B1 | 5/2001 | Ziegler ..................... 438/50 |
| 6,275,122 | B1 | 8/2001 | Speidell et al. ........... 333/186 |

OTHER PUBLICATIONS

S. Cass, "Large Jobs For Little Devices," IEEE Spectrum, pp. 72–73 (2001).

Primary Examiner—Barbara Summons
(74) Attorney, Agent, or Firm—Nixon Peabody LLP

(57) ABSTRACT

A resonator includes a member with an embedded charge, at least one input electrode, at least one output electrode, and at least one common electrode. The input and output electrodes are spaced from and on substantially opposing sides of the member from the common electrode. At least one of the member and the input and output electrodes is movable with respect to the other.

56 Claims, 19 Drawing Sheets

RESONATOR WITH A MEMBER HAVING AN EMBEDDED CHARGE AND A METHOD OF MAKING THEREOF

This application claims the benefit of U.S. Provisional Patent Application Ser. No. 60/318,914 filed Sep. 13, 2001 which is hereby incorporated by reference in its entirety.

FIELD OF THE INVENTION

The present invention relates generally to resonators and, more particularly, to a high Q RF-MEMS resonator and a method thereof.

BACKGROUND OF THE INVENTION

A high Q mechanical resonator is a device which is used to pass frequencies which are very close to the resonant frequency of the mechanical resonator. As disclosed in "Large Jobs for Little Devices" Stephen Cass, IEEE SPECTRUM, Jan. 2001, pp.72–73, which is herein incorporated by reference in its entirety, these high Q mechanical resonators are being operated in the 100+ MHz range.

Unfortunately, there are some problems with the existing high Q mechanical resonators. For example, the performance of these prior high Q resonators has been limited by stiction forces. Additionally, the upper frequency range of these high Q resonators is low restricting their use for some applications. Further these high Q resonators are difficult to fabricate and have a relatively large mass.

SUMMARY OF THE INVENTION

A resonator in accordance with an embodiment of the present invention includes a member with an embedded charge, at least one input electrode, at least one output electrode, and at least one common electrode. The input and output electrodes are spaced from and on substantially opposing sides of the member from the common electrode. At least one of the member and the input and output electrodes is movable with respect to the other.

A method in accordance with an embodiment of the present invention includes providing a member with an embedded charge, providing at least one input electrode, providing at least one output electrode, and providing at least one common electrode. The input and output electrodes are spaced from and on substantially opposing sides of the member from the common electrode. At least one of the member and the input and output electrodes are movable with respect to the other.

A method for passing a signal with a resonator in accordance with an embodiment of the present invention includes receiving an input signal at a resonant frequency for the resonator. A first varying signal is applied on at least a first pair electrodes in response to the received input signal. Each of the first pair of electrodes is spaced from and on substantially opposing sides of a member with an embedded charge. The member oscillates in response to the applied varying signal on the first pair of electrodes. A second varying signal is applied on a second pair electrodes in response to the oscillating of the member. An output signal is transmitted based on the applied second varying signal on the second pair of electrodes.

The present invention provides an rf-MEMS resonator which avoids many of the problems with existing high Q resonators. For example, the present invention avoids the prior problem with stiction. Additionally, the present invention is much simpler to fabricate, can operate at higher frequencies, is more robust, and has a higher reliability than prior resonators. The present invention can be used in a variety of different applications and can be used in a number of different products, including cell phone filters, wireless filters in general, high frequency filter networks.

DETAILED DESCRIPTION

Figure 1:
FIGS. 1–11 are side, cross-sectional views of a method of making a resonator in accordance with an embodiment of the present invention.

A method for making a resonator 10(1) in accordance with an embodiment of the present invention is illustrated in FIGS. 1–11, 13, and 16. In this particular embodiment, the resonator 10(1) includes a chamber 12, a member or resonator membrane 14(1) with an embedded charge 15, two pairs of input electrodes 16(1)–16(2) and 18(1)–18(2) and one pair of output electrodes 20(1)–20(2), although the resonator can comprise other numbers and types of components. The present invention provides high Qrf-MEMS resonators 10(1)–10(5) which are not limited by stiction, can be made very small, can operate in a single mode, can operate at very high frequencies, and can be easily integrated with a variety of different types of semiconductor devices.

Referring to FIGS. 11 and 13–24, resonators 10(1)–10(9) in accordance with embodiments of the present invention are illustrated. Elements in FIGS. 12 and 14–24 which are identical to those described with reference to FIGS. 1–11 and 13, have like numerals. These like elements are identical except as described herein.

In these particular embodiments, each of the resonators 10(1)–10(9) has a high Q, although other variations are possible. Q is defined as the center frequency divided by the bandwidth. In this particular embodiment, the resonators 10(1)–10(9) have a Q over about 1000, although the value of Q can vary.

Each of the resonators 10(1)–10(9) includes a chamber 12 which is made of a variety of layers, although other types of supporting structures for the member 14(1), 14(2), or 14(3) and the electrodes 16(1), 16(2), 18(1), 18(2), 20(1) and 20(2) in other configurations and shapes and with other numbers of layers and made of other materials can be used. The size of the chamber 12 can vary as required by the particular application. For ease of illustration, portions of the chamber 12 are not shown in FIGS. 16–21.

Each of the resonators 10(1)–10(9) also includes a member 14(1), 14(2) and 14(3) with an embedded charge 15. Referring to FIGS. 13, 14, 16, 18, and 21–24 the member 14(1) comprises a pair of layers 22(1) and 22(2) of dielectric material, such as silicon oxide, silicon dioxide, silicon nitride, aluminum oxide, tantalum oxide, tantalum pentoxide, titanium oxide, titanium dioxide, barium strontium titanium oxide, or a material with residual polarization, such as an electret, although other types of materials could be used. The layers 22(1) and 22(2) are seated against each other along an interface 24 were the embedded charge 15 is stored, although other numbers of layers could be used and other types of members which can hold an embedded charge 15 could be used. Referring to FIGS. 15 and 17, the member 14(2) comprises a single layer 26 of dielectric material, such as such as silicon oxide, silicon dioxide, silicon nitride, aluminum oxide, tantalum oxide, tantalum pentoxide, titanium oxide, titanium dioxide, barium strontium titanium oxide, in which the embedded charge 15 is held. Referring to FIGS. 19 and 20, the embedded charge in the member 14(3) is a charged floating conductor. The member 14(3) comprises a single layer 27 of dielectric material, such as such as silicon oxide, silicon dioxide, silicon nitride, aluminum oxide, tantalum oxide, tantalum pentoxide, titanium oxide, titanium dioxide, barium strontium titanium oxide, with an embedded charge 15 that is a charged floating conductor.

Figure 13:
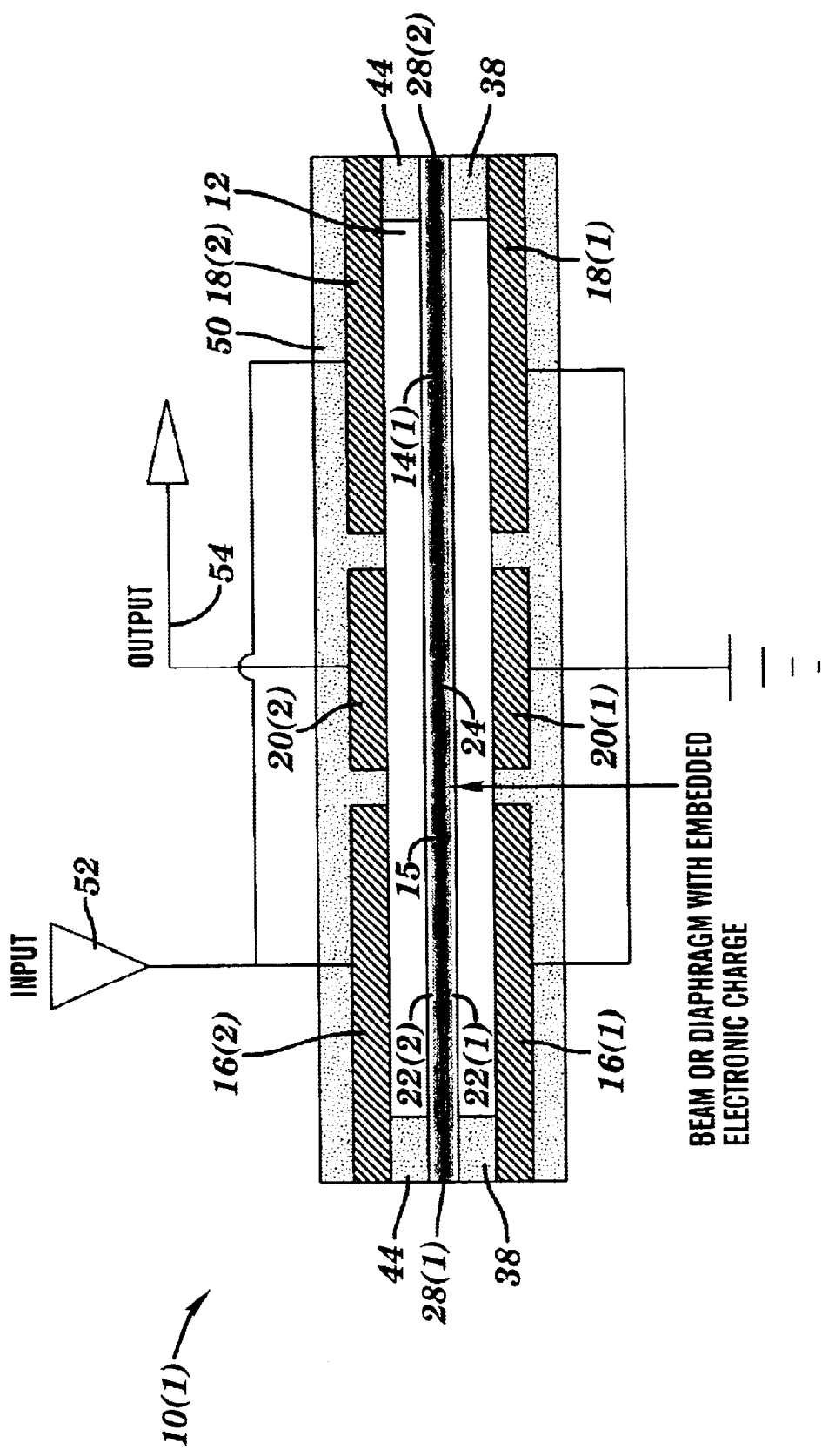
FIG. 13 is a side, cross-sectional view of the resonator shown in FIG. 11 with an input and an output.
Figure 14:
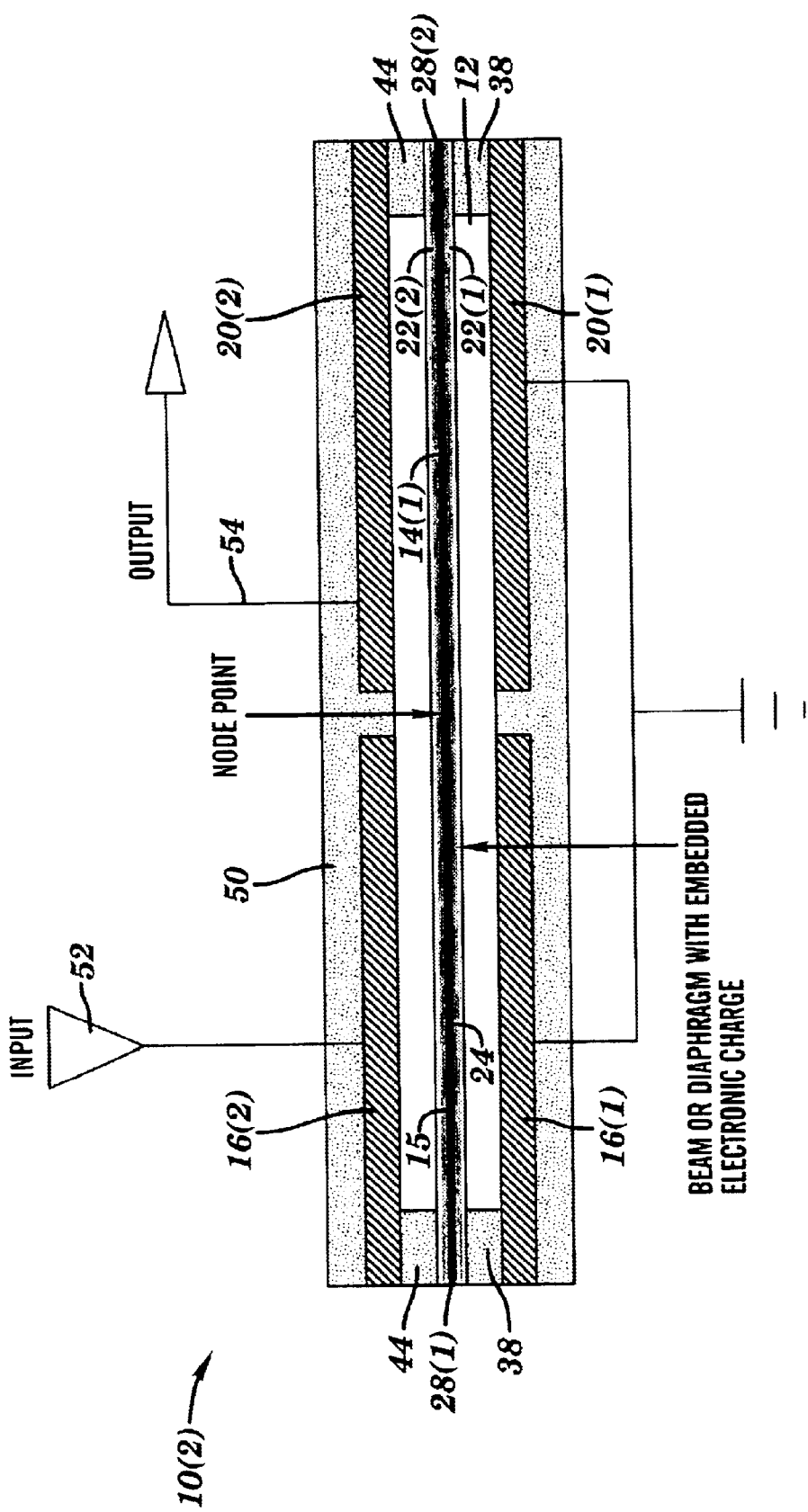
FIG. 14 is side, cross-sectional view of a resonator with a member with embedded charge secured at substantially opposing ends in accordance with another embodiment of the present invention.
Figure 15:
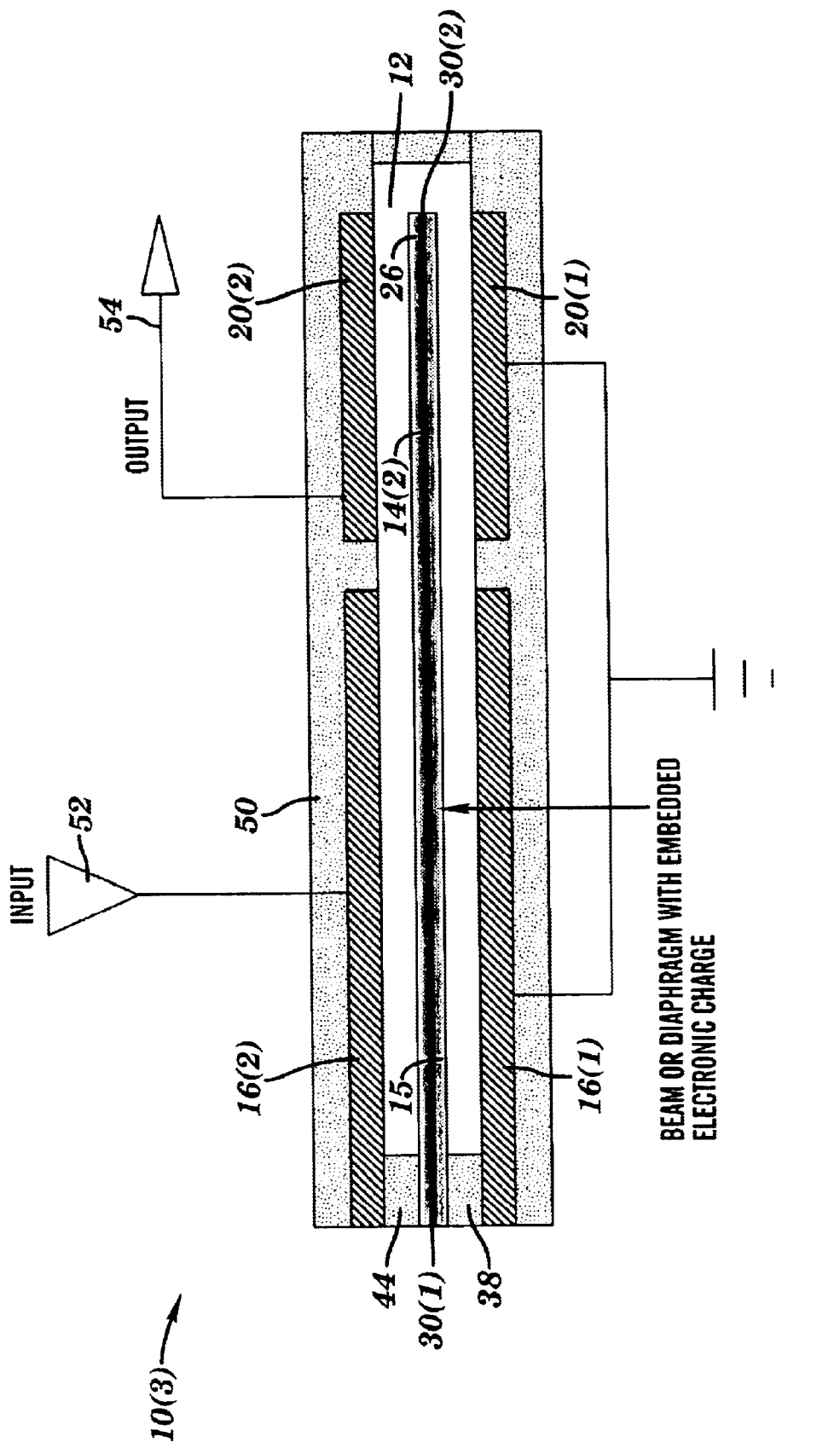
FIG. 15 is a side, cross-sectional view of a resonator in a transceiver with a member with embedded charge secured at one end in accordance with another embodiment of the present invention.
Figure 16:
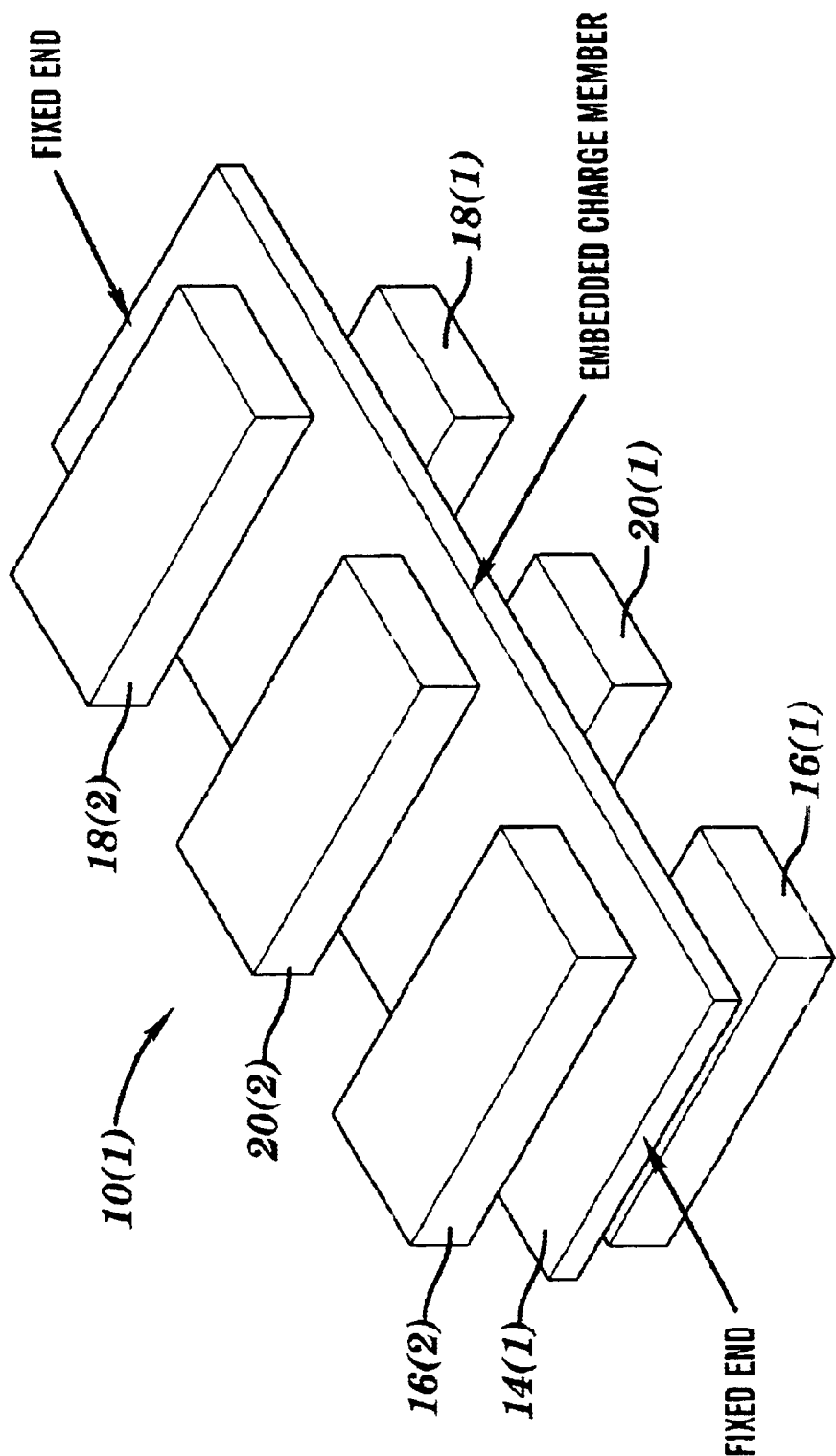
FIG. 16 is a perspective view of a portion of the resonator shown in FIG. 11.
Figure 17:
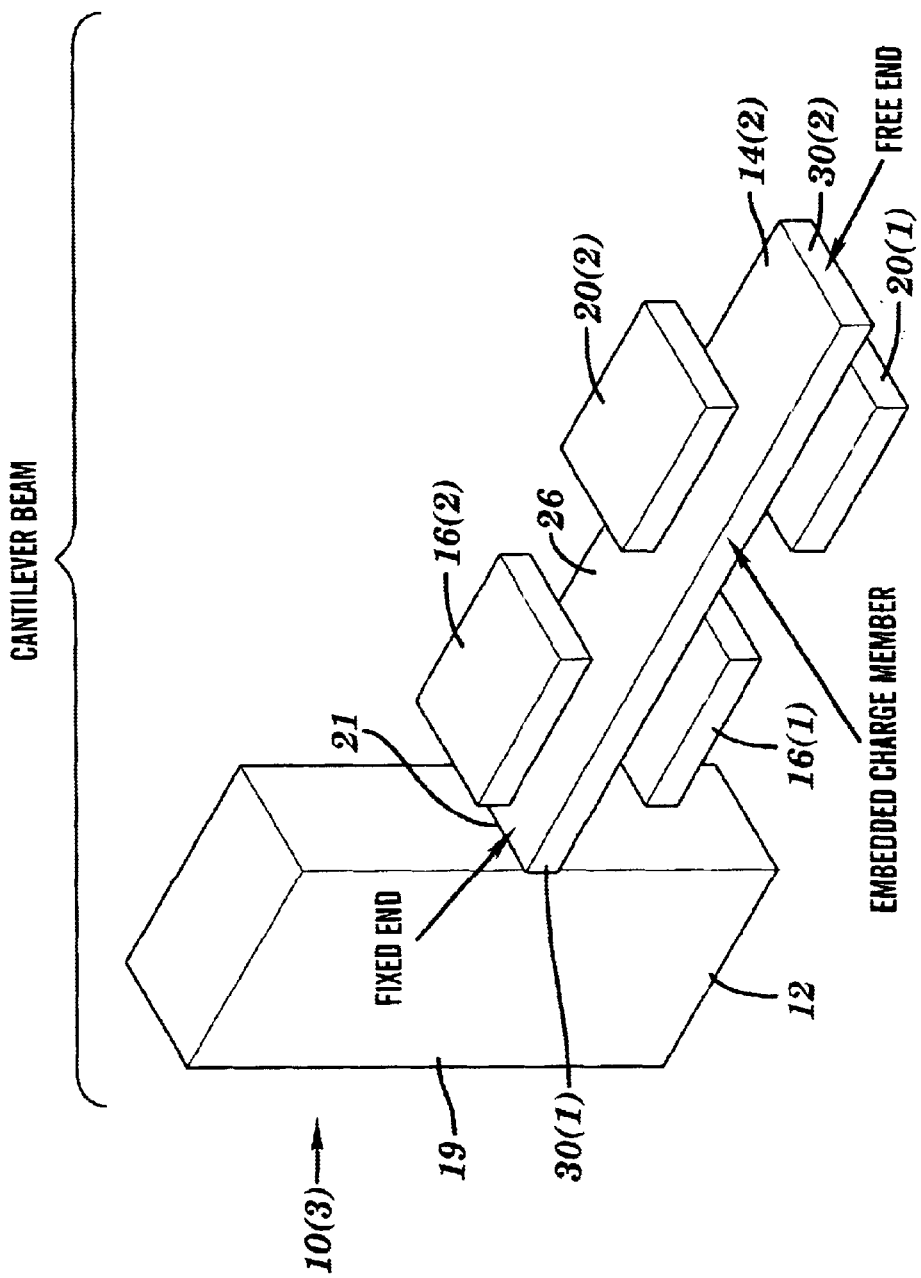
FIG. 17 is a perspective view of a portion of the resonator shown in FIG. 15.

Referring to FIGS. 13, 14, and 16 the member 14(1) is connected at one end 28(1) to an inner wall of the chamber 12, extends across the chamber 12, and has another end 28(2) which is connected on a substantially opposing side to another inner wall of the chamber 12, although other configurations and other types of members can be used can be used. In FIG. 16, the chamber 12 is not shown for ease of illustration, however the ends which are fixed are designated.

Referring to FIGS. 21–24, the member 14(1) is secured on the layer of a layer of insulating material 38 and thus is fixed. In these particular embodiments, the moving or resonating part of the resonators 10(6)–10(9) are the electrodes 16(2), 18(2), and/or 20(2) which are embedded in the insulating layer 50, although other arrangements are possible, such as attaching the electrodes 16(2), 18(2), and/or 20(2) to the insulating layer 50 or burying one or more of the electrodes 16(2), 18(2), and/or 20(2) in the insulating layer 50. Although the spacing of the member 14(1) between the electrodes 16(1), 17, 18(1), and/or 20(1) and the member 14(1) is greater than the spacing between the electrodes 16(2), 18(2), and/or 20(2) and the member 14(1), the spacing is arranges so that the member 14(1) is electrically centered in the resonators 10(6)–10(70 when the permitivities of the layer 38 and the permitivity of the air or other gas or fluid in the chamber 12.

Referring to FIGS. 15 and 17, the member 14(2) is connected at one end 30(1) to an inner wall of the chamber 12, extends across the chamber 12, and has another end 30(2) which is free and is spaced from another inner wall of the chamber 12, although other configurations can be used and other types of members can be used.

Figure 18:
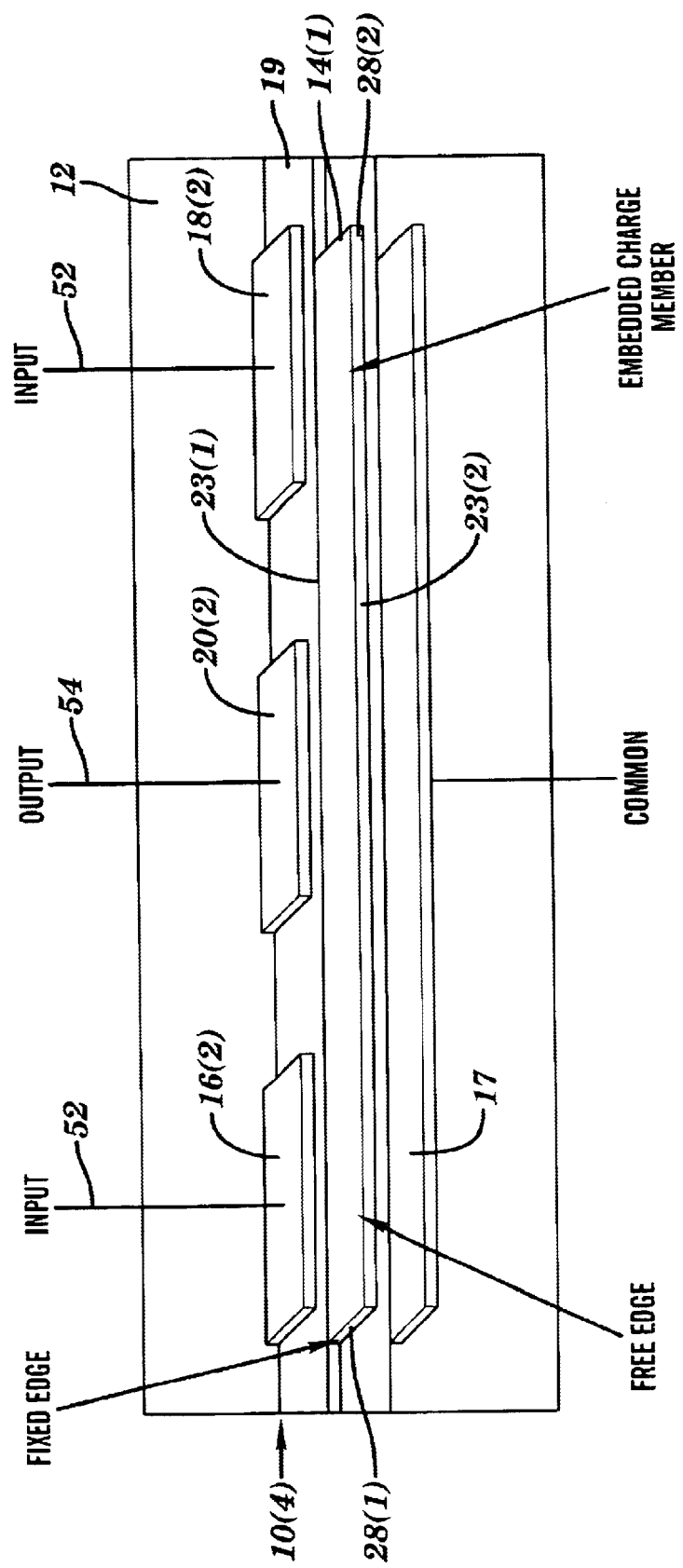
FIG. 18 is a perspective view of a portion of a resonator in accordance with another embodiment of the present invention.
Figure 19:
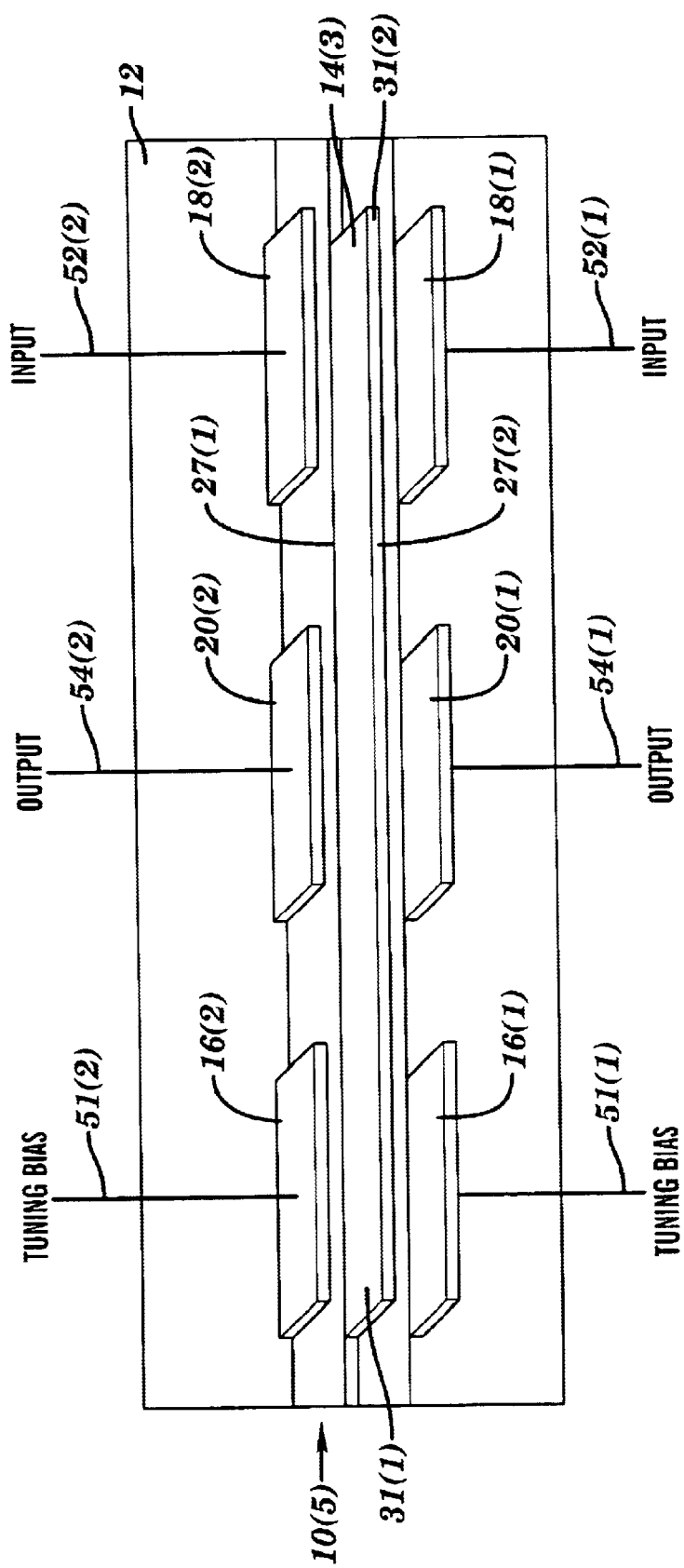
FIG. 19 is a perspective view of a portion of a resonator in accordance with another embodiment of the present invention with leads to an input, output, and tuning bias on the member.
Figure 20:
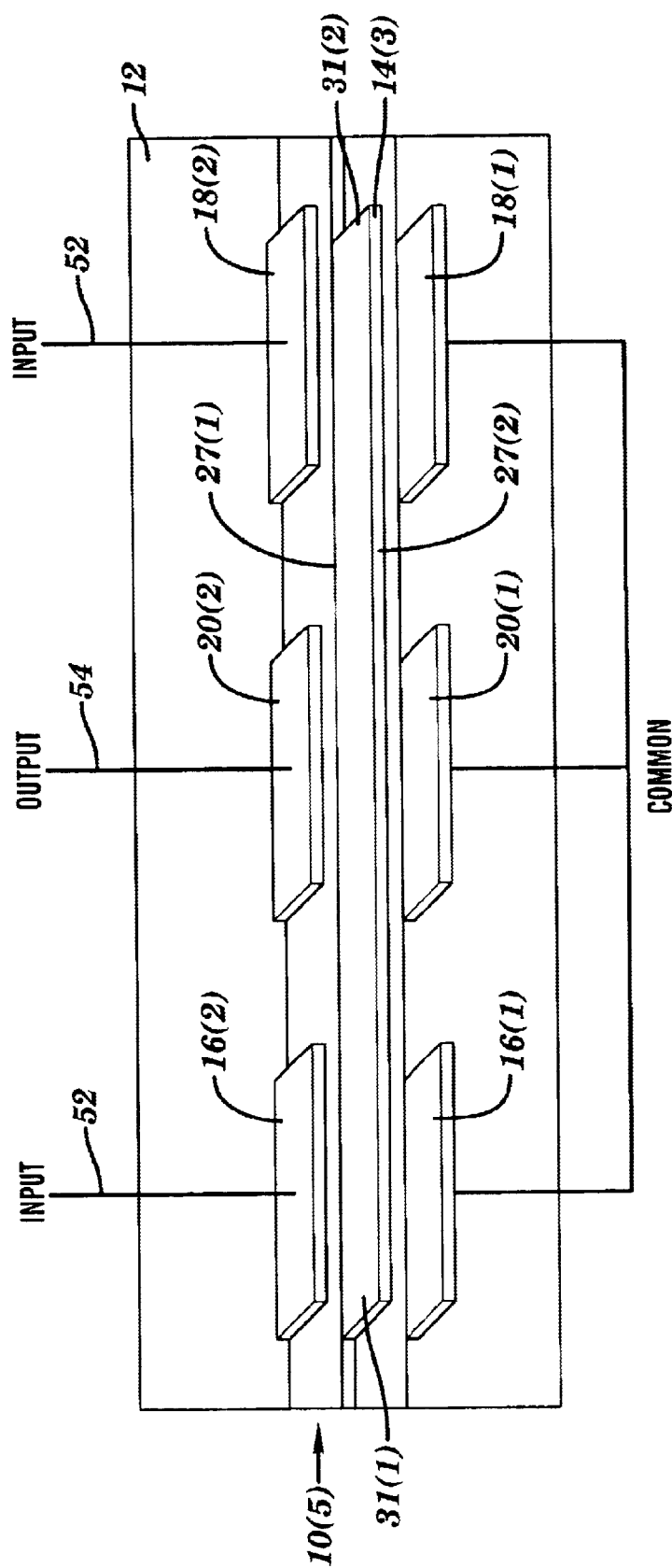
FIG. 20 is a perspective view of a portion of a resonator in accordance with another embodiment of the present invention with leads to inputs, an output, and a common.

Referring to FIGS. 18–20, other variations for connecting the member 14(1), 14(2), and 14(3) are shown which enable the resonator to operate at a higher frequency range above about 100 MHz. Referring to FIG. 18, the member 14(1) is connected along an elongated side 23(1) to an inner wall of the chamber 12 and extends out into the chamber 12 and has another opposing elongated side 23(2) that is free and is spaced from another inner wall of the chamber 12 and the ends 28(1) and 28(2) of the member 14(1) are free, although other configurations can be used and other types of members can be used. Referring to FIGS. 19–20, the member 14(3) is also connected along an elongated side 27(1) to an inner wall of the chamber 12 and extends out into the chamber 12 and has another opposing elongated side 27(2) that is free and is spaced from another inner wall of the chamber 12 and the ends 31(1) and 31(2) of the member 14(1) are free, although other configurations can be used and other types of members can be used.

Referring to FIGS. 13, 16, 19, 20, and 22 the resonators 10(1), 10(5), and 10(7) each include two pairs of input electrodes 16(1)–16(2) and 18(1)–18(2) and one pair of output electrodes 20(1)–20(2), although other combinations of pairs electrodes could be used, such as the resonators 10(2), 10(3), and 10(8) with one pair of input electrodes 16(1)–16(2) and one pair of output electrodes 20(1)–20(2) as shown in FIGS. 14, 15, and 17, resonators 10(4) and 10(6) with input electrodes 16(2) and 18(2), an output electrode 20(2), and a common electrode 17 as shown in FIG. 18, resonator 10(9) with input electrode 16(2), an output electrode 20(2), and a common electrode 17 as shown in FIG. 19. The pairs of input electrodes 16(1)–16(2) and 18(1)–18 (2), the pair of output electrodes 20(1)–20(2), and the common electrode 17 in FIGS. 13–24 are located in the inner walls of the chamber 12, although the input electrodes 16(1)–16(2) and 18(1)–18(2), the output electrodes 20(1) –20(2), and the common electrode 17 could be positioned in other locations, such as buried within the walls of the chamber 12. Each electrode 16(2), 18(2), and 20(2) in each pair is spaced from and located on a substantially opposing sides of the member 14(1) or member 14(2) from the other electrode 16(1), 18(1), and 20(1) in the pair or form the common electrode 17. By way of example only, the distance between each of the pairs of electrodes 16(1)–16(2), 18(1) –18(2), and 20(1)–20(2) or 16(2), 18(2), and/or 20(2) and common electrode 17 is about 0.2 to 2.0 microns, although this distance can vary. Common electrode 17 may be a direct connection to ground, although other configurations can be used, such as coupling to a common reference level.

Figure 12:
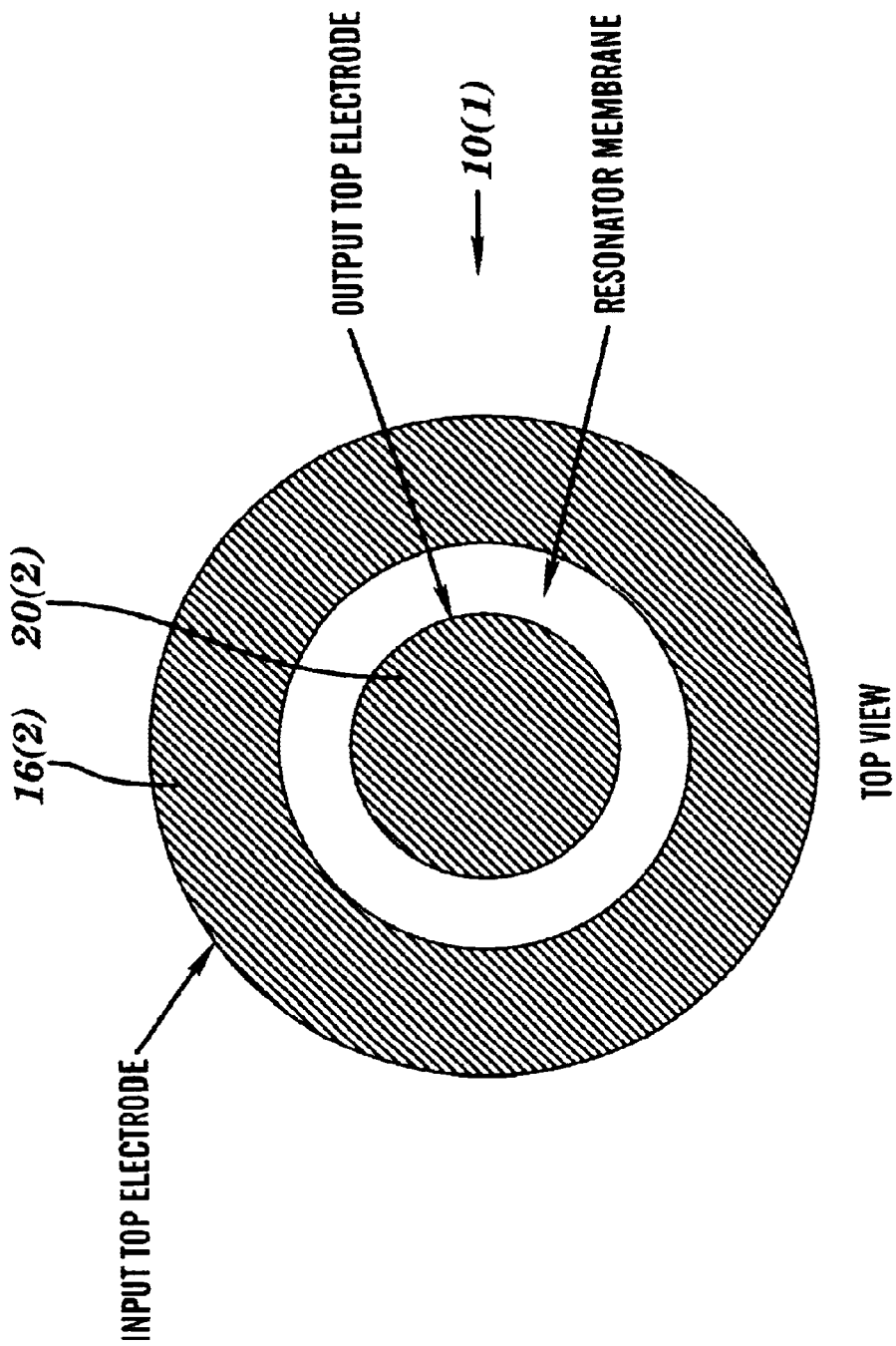
FIG. 12 is a top, cross-sectional view of a resonator with an output electrode with a circular shape and an input electrode which is spaced from and surrounds the output electrode in accordance with another embodiment.

Referring to FIGS. 13, 16, 19, 20, and 22, the two pairs of input electrodes 16(1)–16(2) and 18(1)–18(2) are each adjacent opposing ends 28(1) and 28(2) or 31(1) and 31(2) of the member 14(1) or 14(3) and are located on opposing sides of the pair of output electrodes 20(1)–20(2), although other configurations could be used. For example, the resonators 10(1), 10(5), and 10(9) could have one pair of output electrodes 20(1)–20(2) with a substantially circular shape surrounded by one pair of input electrodes 16(1)–16(2) having a substantially annulus shape as shown in FIG. 12, although the input and output electrodes could have other shapes or be in an opposite orientation. This one pair of input electrodes 16(1)–16(2) having an annulus shape would replace the two pairs of input electrodes 16(1)–16(2) and 18(1)–18(2) shown in FIGS. 13, 16, 19, 20, and 22.

Figure 23:
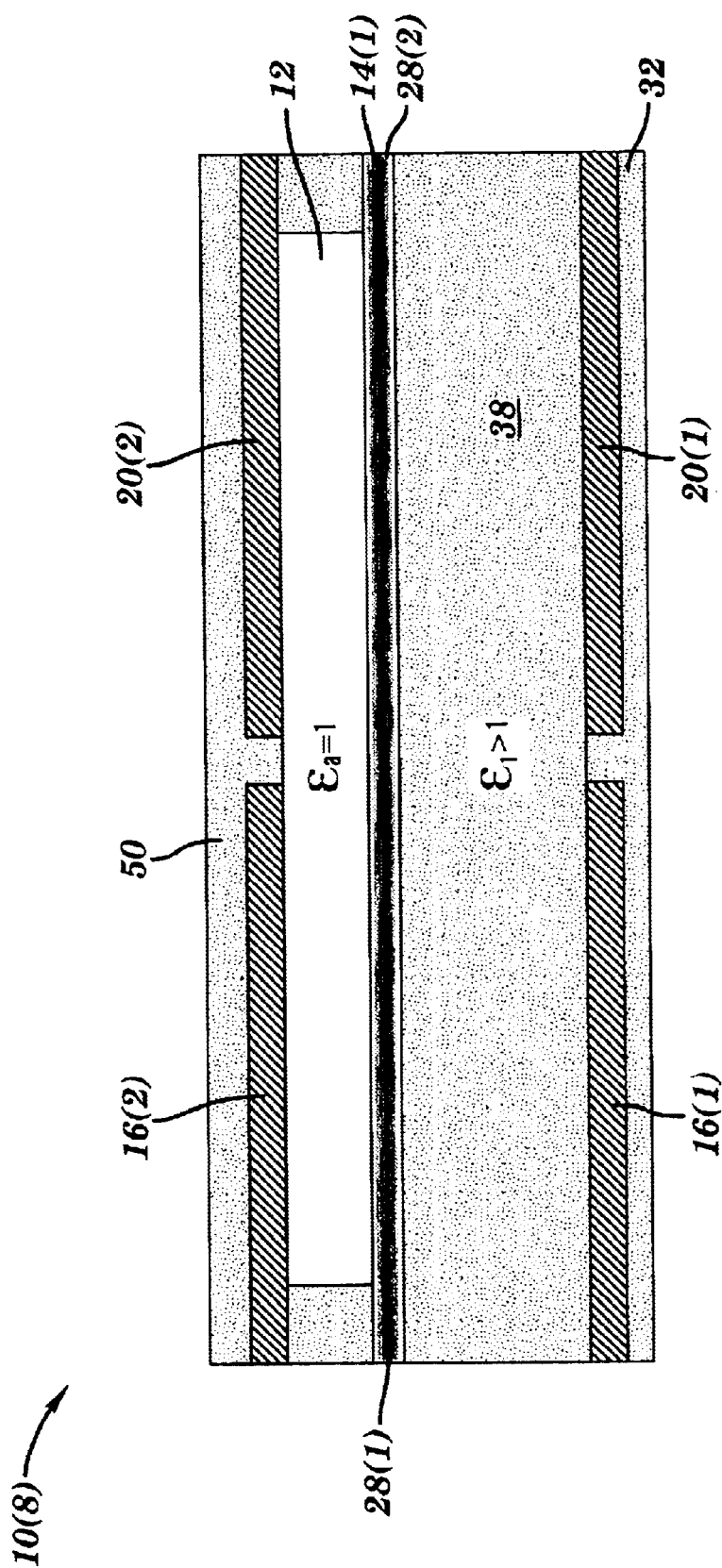
FIG. 23 is a side, cross-sectional view of a resonator with corresponding input and output electrodes on each side of the member in accordance with another embodiment.

Referring to FIGS. 14 and 23, one pair of input electrodes 16(1)16(2) are positioned adjacent one end 28(1) of the member 14(1) and the other pair of electrodes 20(1)–20(2) are adjacent the other end 28(2) of the member 14(1), although other configurations could be used.

Referring to FIGS. 15 and 17, one pair of input electrodes 16(1)–16(2) are positioned adjacent one end 28(1) of the member 14(2) and the other pair of electrodes 20(1)–20(2) are adjacent the other end 28(2) of the member 14(2), although other configurations could be used.

Figure 21:
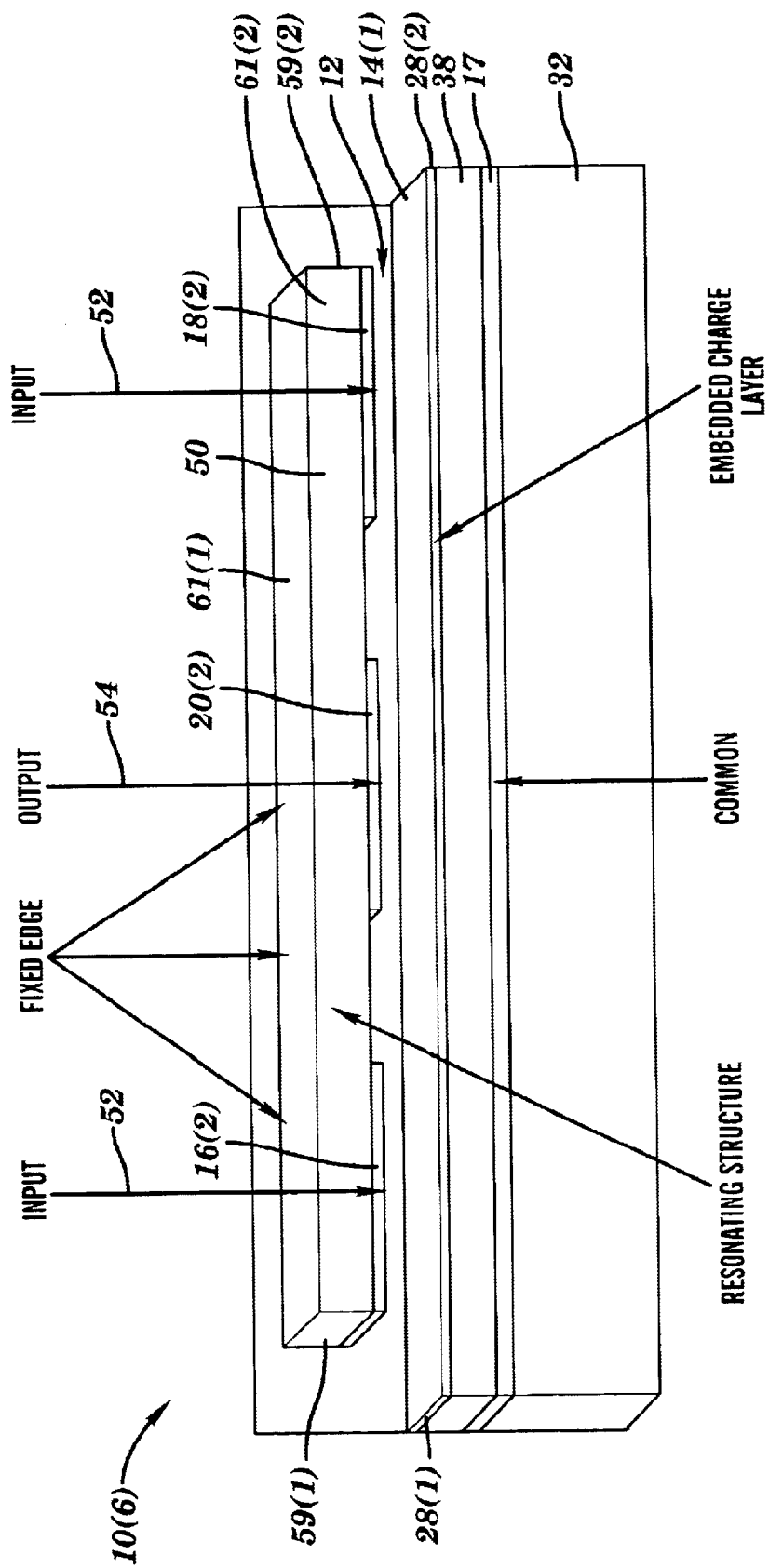
FIG. 21 is a perspective view of a portion of a resonator with a pair of input electrodes, an output electrode, and a common electrode in accordance with another embodiment of the present invention.

Referring to FIGS. 18 and 21, input electrodes 16(2) and 18(2) are each adjacent opposing ends 28(1) and 28(2) of the member 14(1) and are located on opposing sides of the output electrodes 20(2) and a common electrode 17 is on the opposing side of the member 14(1) from electrodes 16(2), 18(2), and 20(2), although other configurations could be used.

Figure 24:
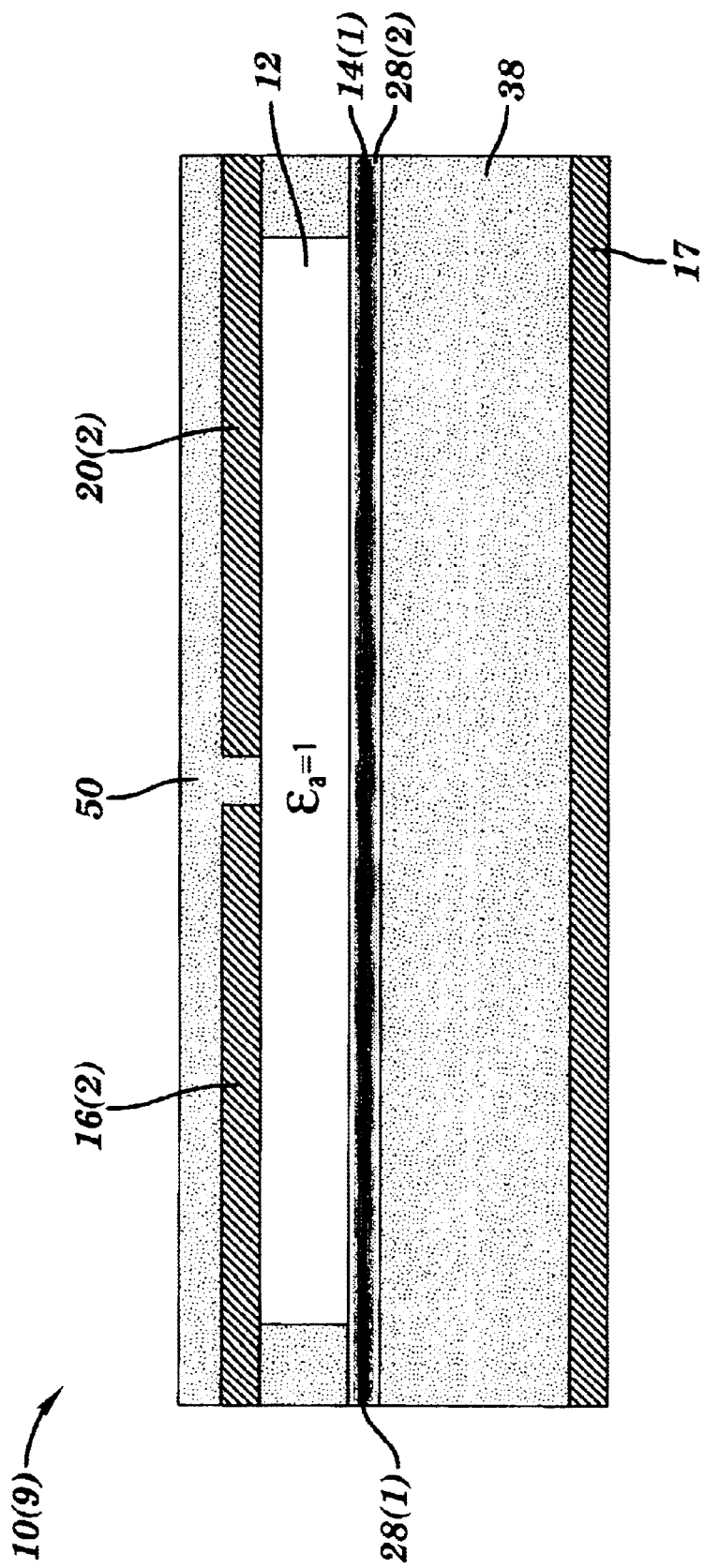
FIG. 24 is a side, cross-sectional view of a resonator with an input electrode, an output electrode, and a common electrode in accordance with another embodiment.

Referring to FIG. 24, input electrode 16(2) and output electrode 20(2) are each adjacent opposing ends 28(1) and 28(2) of the member 14(1) and a common electrode 17 is on the opposing side of the member 14(1) from electrodes 16(2) and 20(2), although other configurations could be used.

Figure 22:
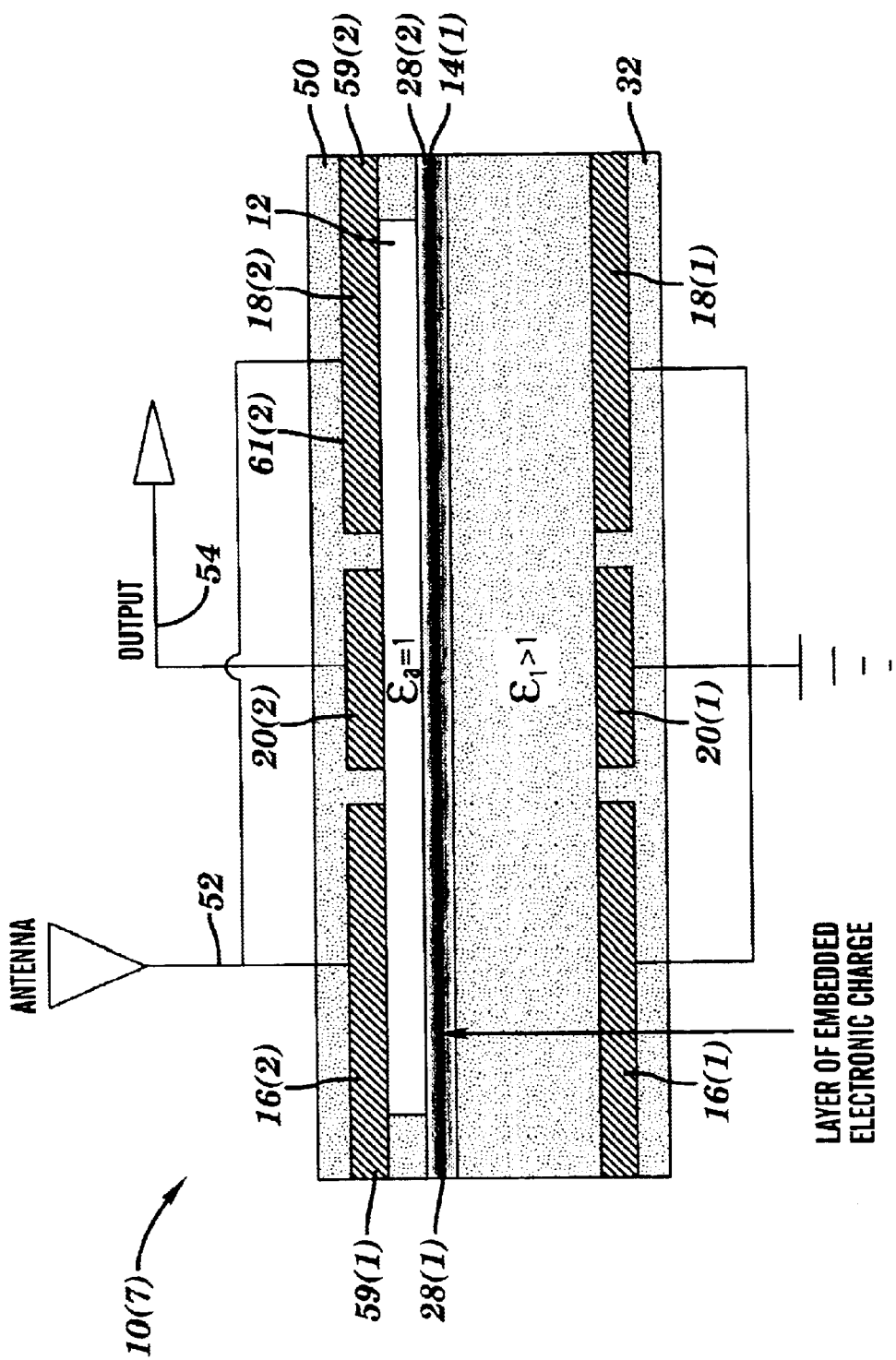
FIG. 22 is a side, cross-sectional view of the resonator with two pairs of corresponding input electrodes and a corresponding pair of output electrodes in accordance with another embodiment.

Referring to FIGS. 13, 20, and 22, an input lead 52, such as an antenna, is coupled to the input electrodes 16(2) and 20(2), although other types of input devices could be used. An output lead 54 is coupled to the output electrode 20(2), and a common, such as ground, is coupled to the input electrodes 16(1) and 18(1) and to output electrode 20(1), although other common reference levels could be used.

Referring to FIGS. 14 and 15, an input lead 52, such as an antenna, is coupled to the input electrode 16(2), although other types of input devices could be used. An output lead 54 is coupled to the output electrode 20(2), and a common, such as ground, is coupled to the input electrode 16(1) and to output electrode 20(1), although other common reference levels could be used.

Referring to FIG. 18, an input lead 52, such as an antenna, is coupled to the input electrodes 16(2) and 18(2), although other types of input devices could be used. An output lead 54 is coupled to the output electrode 20(2), and a common, such as ground, is coupled to the common electrode 17, although other common reference levels could be used.

Referring to FIG. 19, a tuning bias input 51(1) and 51(2) is coupled to input electrodes 16(1) and 16(2) to tune the resonator 10(5) to a particular frequency. The other resonators 10(1)–10(4) can be configured to apply a tuning bias to tune the resonator to a particular frequency. An input lead 52(1) and 52(2) is coupled across the input electrodes 18(1) and 18(2) and an output lead 54(1) and 54(2) is coupled across the output electrodes 20(1) and 20(2), although other configurations can be used.

Referring to FIG. 21, an input lead 52, such as an antenna, is coupled to the input electrodes 16(2) and 18(2), although other types of input devices could be used. An output lead 54 is coupled to the output electrode 20(2), and a common, such as ground, is coupled to the common electrode 17, although other common reference levels could be used.

A method for making a resonator 10(1) in accordance with an embodiment of the present invention in accordance with an embodiment will be described with reference to FIGS. 1–11, 13, and 16. Referring more specifically to FIG. 1, a layer 32 of insulating material, such as $SiO_2$ is provided, although other types of materials and other numbers of layers could be used. For example, the layer 32 of insulating material could be deposited on a substrate which acts as the base.

Figure 2:
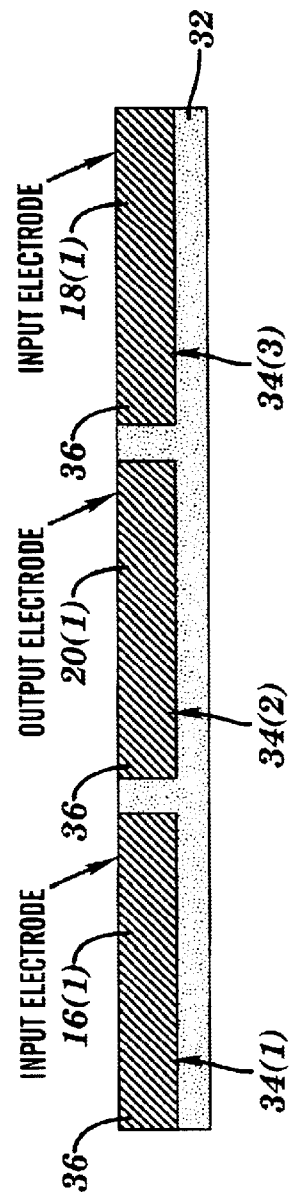

Referring to FIG. 2, three openings or trenches 34(1)–34(3) are patterned and etched into the layer 32 of insulating material and then a conductive material 36, such as Cu, is deposited in each of the openings 34(1)–34(3) to form electrodes 16(1), 18(1), and 20(1), although other types of conductive materials could be used, the number of openings etched can vary depending on the number of electrodes desired, and other techniques for forming the electrodes can be used. The deposited conductive material 36 may be planarized.

Figure 3:
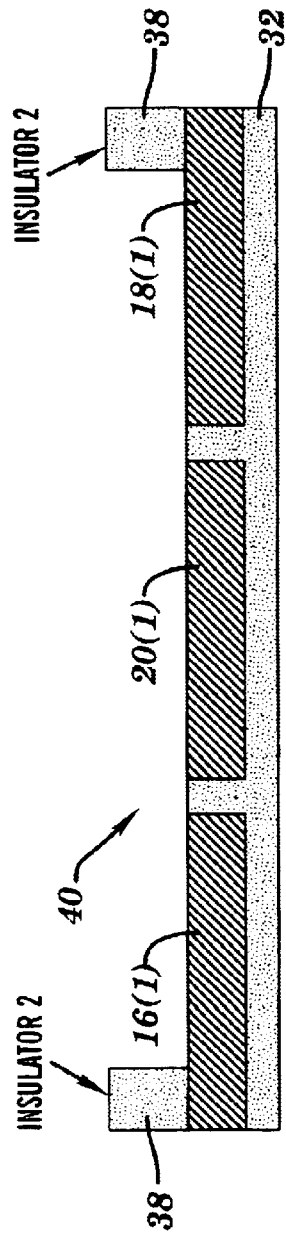

Referring to FIG. 3, a layer 38 of insulating material, such as $SiO_2$, may be deposited on a portion of the conductive material 36 in the openings 34(1)–34(3) and on a portion of the exposed layer 32 of insulating material. Next, an opening or trench 40 is patterned and etched in the layer 38 of insulating material which extends to a portion of the conductive material 36 in the openings 34(1)–34(3) and on a portion of the exposed layer 32 of insulating material, although the opening 40 can extend to other depths, such as a depth where the electrodes 16(1), 18(1), and 20(1) would still be covered by a portion of the layer 38 of insulating material or by another insulating layer or layers.

Figure 4:
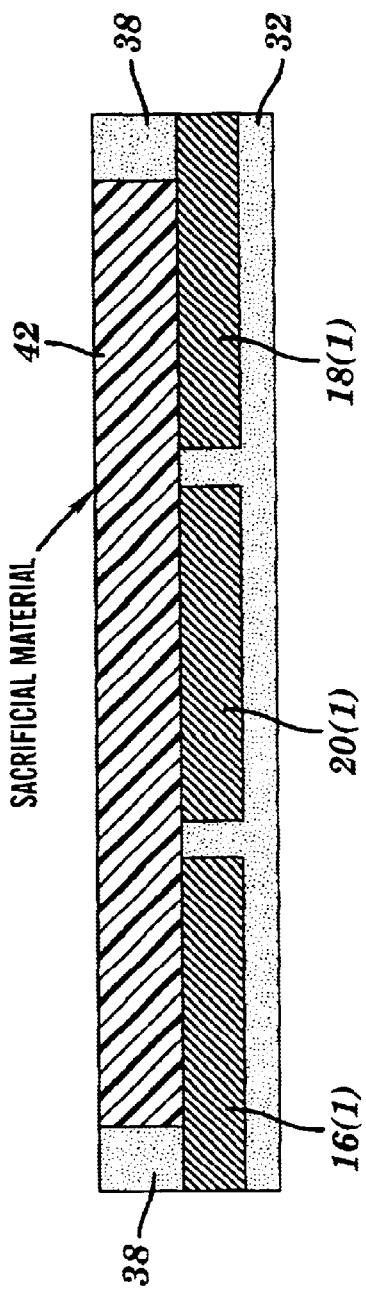

Referring to FIG. 4, a layer 42 of sacrificial material, such as polysilicon, is deposited in the opening 40 in the layer 38 of insulating material, although other types of sacrificial materials could be used, such as polymers. The layer 42 of sacrificial material may be planarized.

Figure 5:
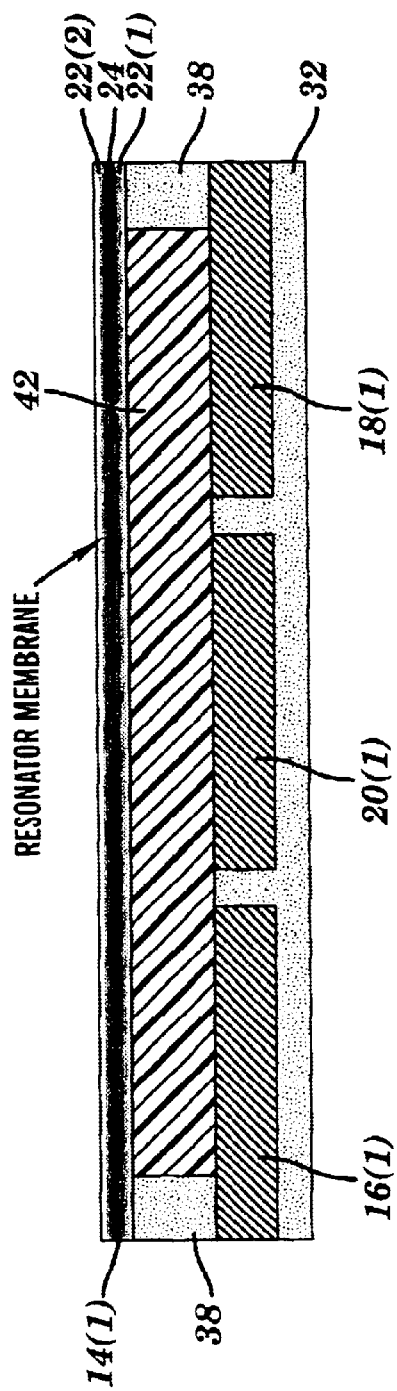

Referring to FIG. 5, a layer 22(1) of insulating material, such as a layer of silicon oxide, is deposited on the layer 42 of sacrificial material and a portion of layer 38 of insulating material which is exposed. Another layer of insulating material 22(2), such as a layer of silicon nitride, is deposited on the layer 22(1) of insulating material to form the member 14(1). An embedded charge 15 can be held at an interface 24 between the layers 22(1) and 22(2) of insulating material. Although two layers 22(1) and 22(2) are shown, the member 14(1) can be comprised of other numbers of layers, such as one layer 26 as shown in FIGS. 15 and 17, one layer 27 with embedded charge 15 which is a charged floating conductor as shown in FIGS. 19 and 20, or three or more layers. In a member with multiple layers, the embedded charge 15 can be held at one or more of the interfaces between the multiple layers.

Figure 6:
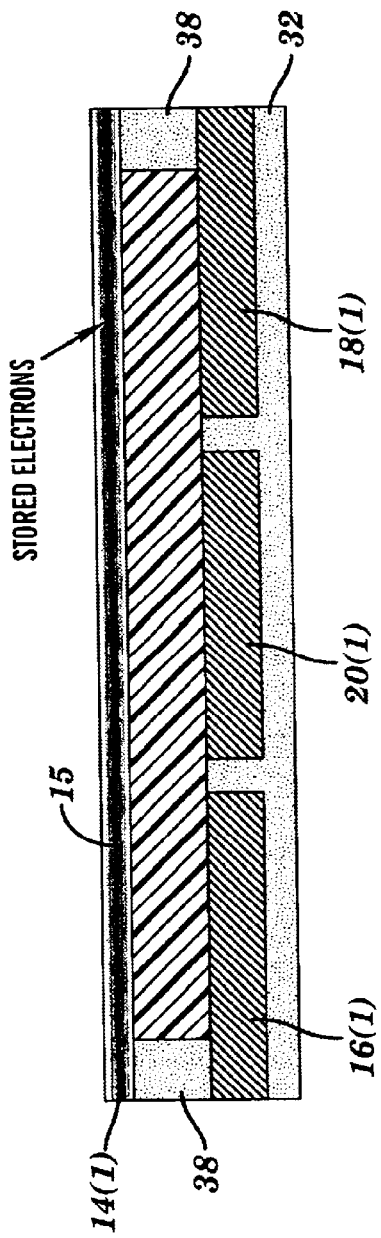

Referring to FIG. 6, electrons are injected into the member 14(1) with an electron gun to deposit an embedded charge 15, although other techniques for storing embedded charge 15 in the member 14(1) can also be used, such as applying an electrical bias across the member 14(1) sufficient to cause electron injection, ballistic injection, polarization, and high field injection. The same techniques can be used to store an embedded charge 15 in the member 14(2) shown in FIGS. 15 and 17 and a charged floating conductor as the embedded charge 15 in the member 14(3) in FIGS. 19 and 20.

Figure 7:
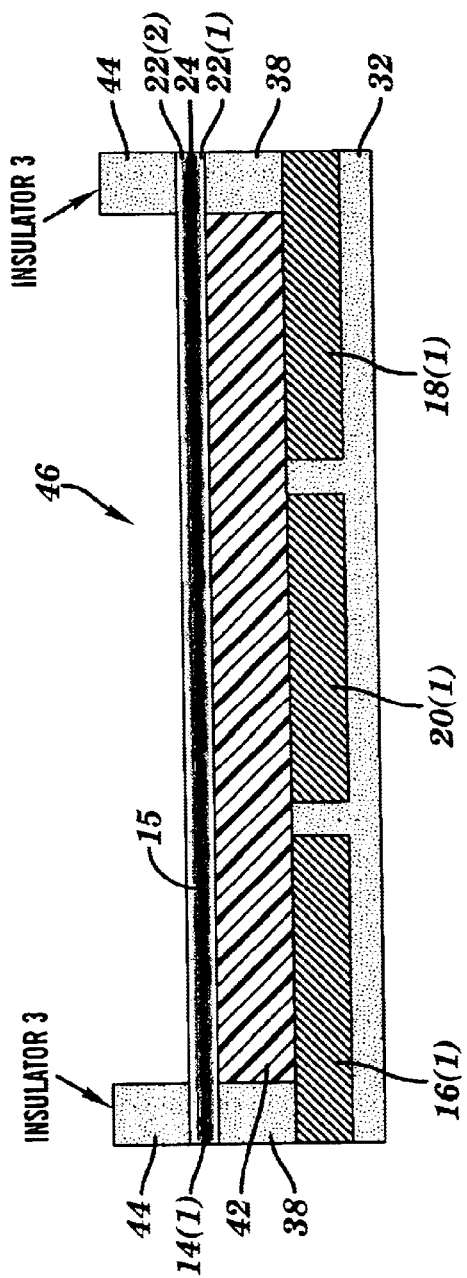

Referring to FIG. 7, a layer 44 of insulating material, such as SiO$_2$, is deposited on the member 14(1), although other types of insulating materials could be used. Next, an opening or trench 46 is patterned and etched in the layer 44 of insulating material which extends to member 14(1).

Figure 8:
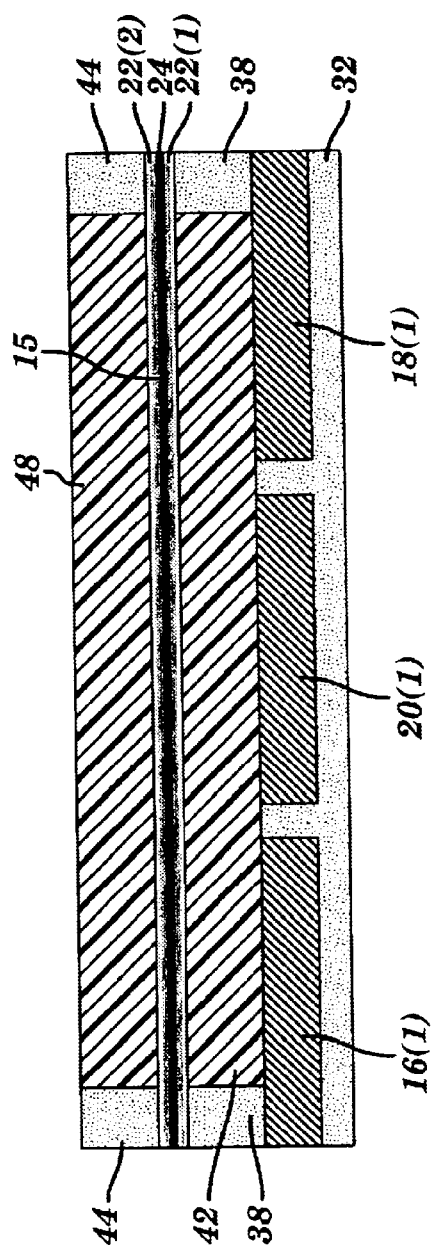

Referring to FIG. 8, a layer 48 of sacrificial material, such as polysilicon, is deposited in the opening 46 in the layer 44 of insulating material, although other types of sacrificial materials could be used. The layer 48 of sacrificial material may be planarized.

Figure 9:
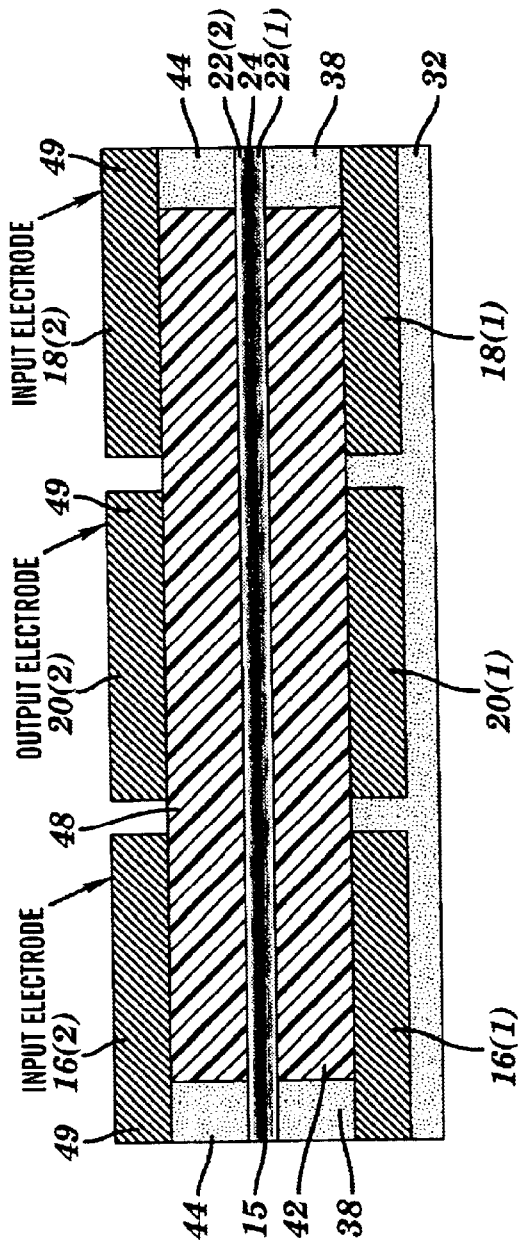

Referring to FIG. 9, a layer 49 of conductive material, such as Cu, is deposited on the layer 48 of sacrificial material and on the exposed portion of the layer 44 of insulating material, although other types of conductive materials could be used. The layer 49 of conductive material is patterned and etched to form electrodes 16(2), 18(2), and 20(2).

Figure 10:
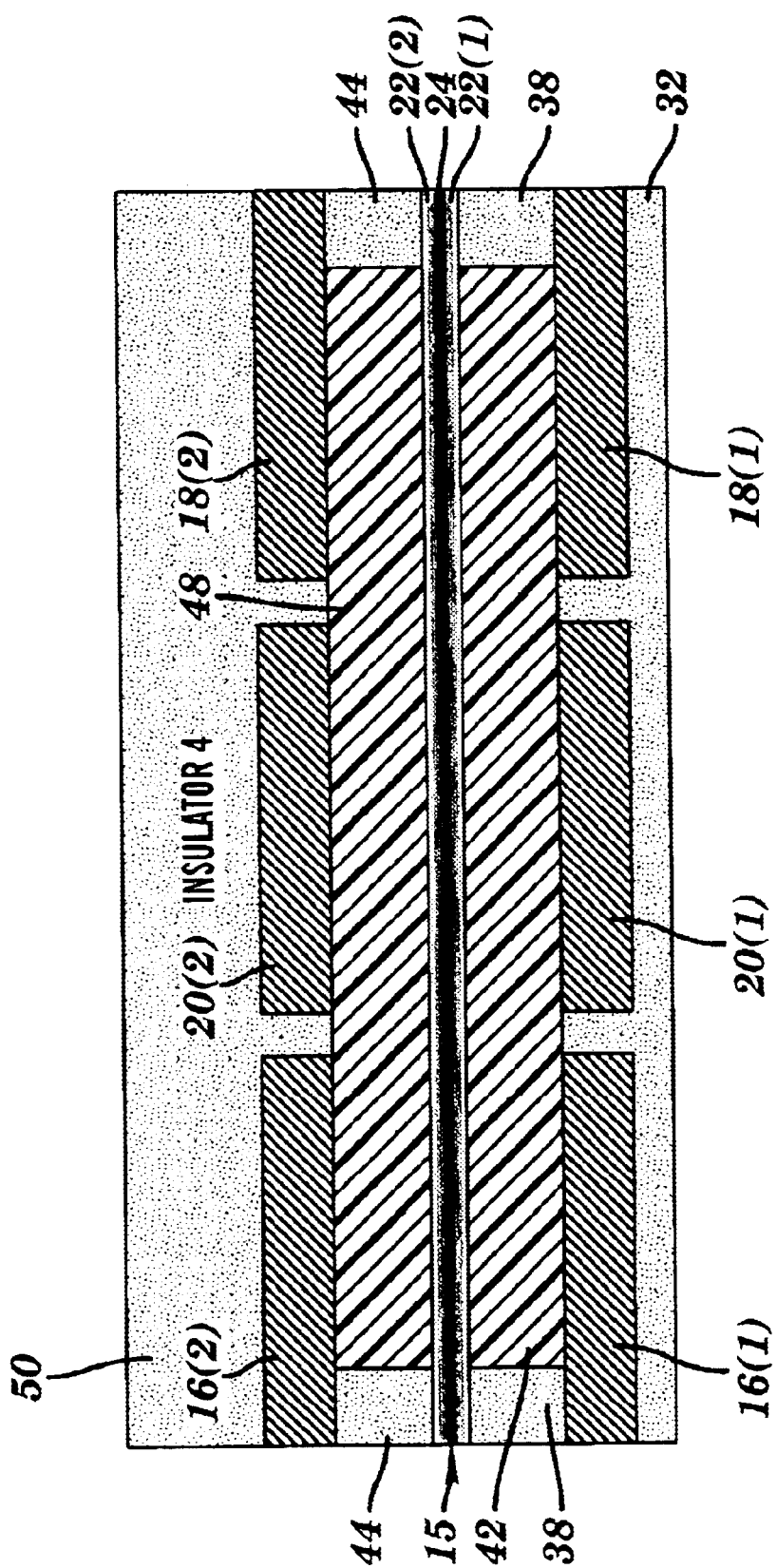

Referring to FIG. 10, a layer 50 of insulating material, such as SiO$_2$, is deposited over the remaining portion of the layer of conductive material 49 which forms electrodes 16(2), 18(2), and 20(2). The layer 50 of insulating material encapsulates and supports the electrodes 16(2), 18(2), and 20(2).

Figure 11:
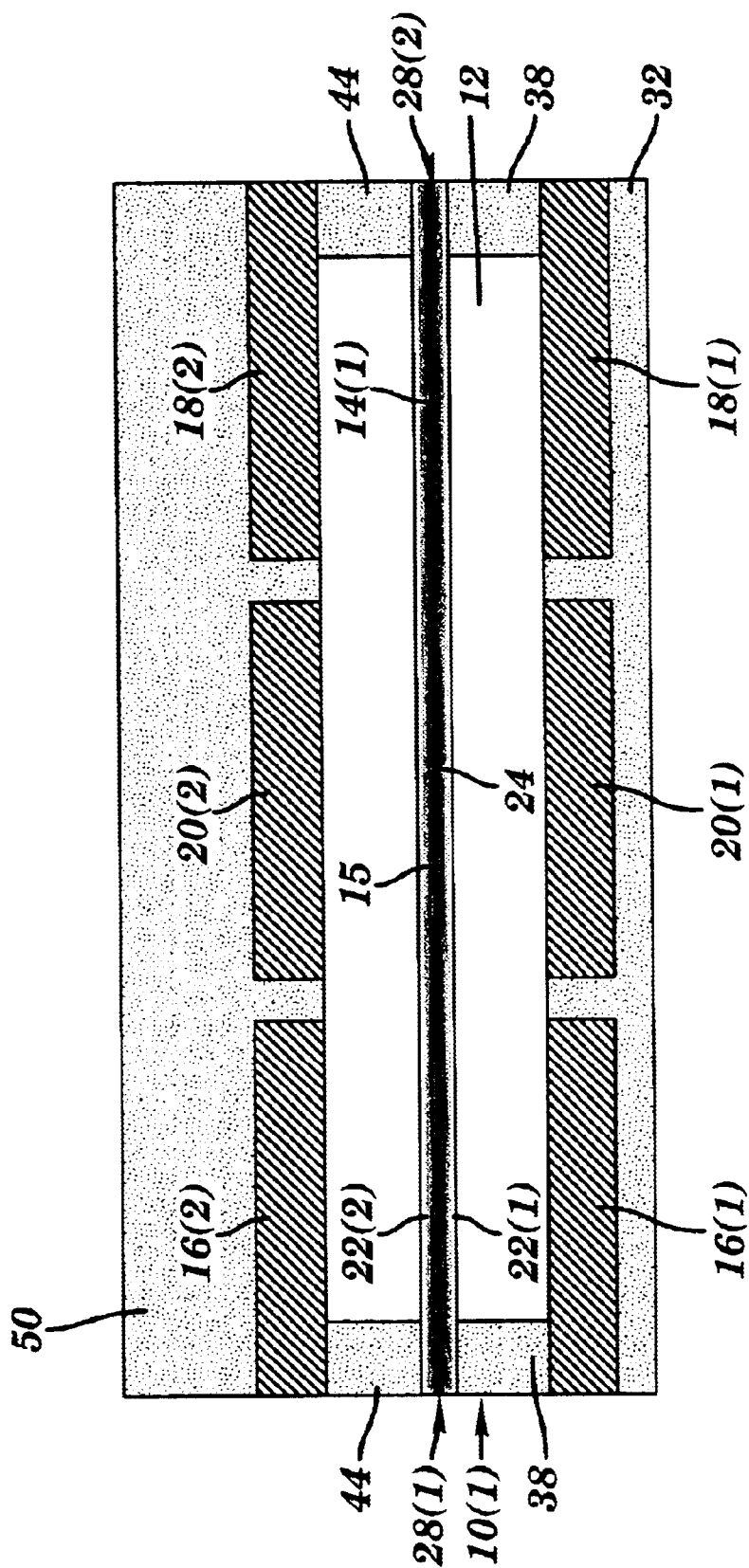

Referring to FIG. 11, an access hole or holes (not shown) to the layers 42 and 48 of sacrificial material are formed and the layers 42 and 48 of sacrificial material are removed through the access hole or holes to form the chamber 12, although other techniques for removing the layers 42 and 48 of sacrificial material can be used. The access hole or holes are closed and the chamber 12 can be sealed in a vacuum or filled with one or more gases depending on the particular application. Although not shown, suitable vias are made to electrodes 16(1), 16(2), 17, 18(1), 18(2), 20(1), and 20(2) for the different resonators 10(1)–10(5) for providing access for electrical contact, although other techniques for providing electrical coupling to electrodes 16(1), 16(2), 17 18(1), 18(2), 20(1), and 20(2) could be used.

The method for making the resonator 10(2) shown in FIG. 14 is the same as the method described above for making the resonator 10(1) shown in FIGS. 11, 13, and 16 except as described below. In this particular embodiment, the layer 32 of insulating material shown in FIG. 2 is patterned and etched to form two openings which are filled with the conductive material 36 to form the two electrodes 16(1) and 20(1). Additionally, the layer 49 of conducting material shown in FIG. 9 is patterned and etched to form the two electrodes 16(2) and 20(2).

The method for making the resonator 10(3) shown in FIGS. 15 and 17 is the same as the method described above for making the resonator 10(1) shown in FIGS. 11, 13, and 16 except as described below. In this particular embodiment, the layer 32 of insulating material shown in FIG. 2 is patterned and etched to form two openings which are filled with the conductive material 36 to form the two electrodes 16(1) and 20(1). Additionally, in this particular embodiment only one layer 26 of insulating material, such as electret, is deposited in FIG. 5 to from the member 14(2) and the one layer 26 of insulating material is patterned and etched to remove a portion of the member 14(2) which extends over to a portion of the layer 38 of insulating material. As a result, the resulting member 14(2) which is formed is only connected at one end 30(1) to the chamber 12 and has an opposing end 30(2) which is spaced from an inner wall of the chamber 12. Further, in this particular embodiment the layer 49 of conducting material shown in FIG. 9 is patterned and etched to form the two electrodes 16(2) and 20(2).

The method for making the resonator 10(4) shown in FIG. 18 is the same as the method described above for making the resonator 10(1) shown in FIGS. 11, 13, and 16 except as described below. In this particular embodiment, the layer 32 of insulating material shown in FIG. 2 is not patterned and etched. The deposited layer of conductive material 36 is not patterned or etched and forms the common electrode 17, although other arrangements can be used, such as starting with a substrate made of a conductive material which acts as the common electrode 17.

The method for making the resonator 10(5) shown in FIGS. 19 and 20 is the same as the method described above for making the resonator 10(1) shown in FIGS. 11, 13, and 16 except as described below. In this particular embodiment, the layers of insulating material 22(1) and 22(2) which comprise member 14(1) are formed to have ends 28(1) and 28(2) free and spaced from the inner wall of the chamber 12, elongated side 23(1) of the member 14(1) is secured in the inner wall of the chamber 12, and elongated side 23(2) is free and spaced form the inner wall of the chamber 12, although other configurations could be used.

The method for making the resonator 10(6) shown in FIG. 21 is the same as the method described above for making the resonator 10(1) shown in FIGS. 11, 13, and 16 except as described below. In this particular embodiment, the deposited layer of conductive material 36 is not patterned or etched and forms the common electrode 17, although other arrangements can be used, such as starting with a substrate made of a conductive material which acts as the common electrode 17. Additionally, the layer 38 of insulating material shown in FIG. 3 is not patterned or etched and the layer 22(1) of the member 14(1) is formed on the layer 38. Further, the layer 50 of insulating material shown in FIG. 10 is formed to have ends 59(1) and 59(2) and elongated side 61(1) free, while elongated side 61(2) of layer 50 is fixed so that the electrodes 16(2), 18(2), and 20(2) and layer 50 can move and resonate.

The method for making the resonator 10(7) shown in FIG. 22 is the same as the method described above for making the resonator 10(1) shown in FIGS. 11, 13, and 16 except as described below. In this particular embodiment, the layer 38 of insulating material shown in FIG. 3 is not patterned or etched and the layer 22(1) of the member 14(1) is formed on the layer 38. Additionally, the layer 50 of insulating material shown in FIG. 10 is formed so that the electrodes 16(2), 18(2), and 20(2) and layer 50 can move and resonate.

The method for making the resonator 10(8) shown in FIG. 23 is the same as the method described above for making the resonator 10(1) shown in FIGS. 11, 13, and 16 except as described below. In this particular embodiment, the layer 32 of insulating material shown in FIG. 2 is patterned and etched to form two openings which are filled with the conductive material 36 to form the two electrodes 16(1) and 20(1). Additionally, the layer 38 of insulating material shown in FIG. 3 is not patterned or etched and the layer 22(1) of the member 14(1) is formed on the layer 38. Further, the layer 50 of insulating material shown in FIG. 10 is formed so that the electrodes 16(2) and 20(2) and layer 50 can move and resonate.

The method for making the resonator 10(9) shown in FIG. 24 is the same as the method described above for making the resonator 10(1) shown in FIGS. 11, 13, and 16 except as described below. In this particular embodiment, a substrate made of a layer 17 of conductive material is provided that is not patterned or etched and forms the common electrode 17, although other arrangements can be used, such as using other numbers and types of layers of materials. Additionally, the layer 38 of insulating material shown in FIG. 3 is not patterned or etched and the layer 22(1) of the member 14(1) is formed on the layer 38. Further, the layer 50 of insulating material shown in FIG. 10 is formed so that the electrodes 16(2) and 20(2) and layer 50 can move and resonate.

The operation of the resonators 10(1)–10(9) to pass one or more signals will now be discussed with reference to FIGS. 13–24. If a tuning bias is applied across the tuning bias inputs 51(2) and 51(2), the resonant frequency of the resonator can be tuned to a particular frequency. When an input signal that includes the resonant frequency is received on input lead 52 or across input leads 52(1) and 52(2), the incoming signal applies or induces a varying signal, such as a varying amplitude signal or a varying frequency signal, on the pairs of input electrodes 16(1), 16(2), 18(1), and/or 18(2) coupled to the input lead 52 or across the leads 52(1) and 52(2) which correlates to the resonant portion of the incoming signal. The varying signal on the pairs of input electrodes 16(1)–16(2) and 18(1)–18(2) or 16(1)–16(2) causes the member 14(1) or 14(2) with the embedded charge 15 to oscillate in response to the received varying signal. The movement of the member 14(1) or 14(2) with the embedded charge 15 causes a varying signal, such as a varying amplitude signal or a varying frequency signal, to be applied or induced on the pairs of output electrodes 20(1)–20(2) which is transmitted out as an output signal on the output lead 54 or across the output leads 54(1) and 54(2).

When the output lead 54 or leads 54(1) and 54(2) receives an outgoing signal at the resonant frequency to transmit, the outgoing signal induces a varying signal, such as a varying amplitude signal or a varying frequency signal, on the pairs of output electrodes 20(1)–20(2) in response to the outgoing signal. The varying signal on the pairs of output electrodes 20(1)–20(2) causes the member 14(1) or 14(2) with the embedded charge 15 to oscillate in response to the varying signal. The movement of the member 14(1) or 14(2) with the embedded charge 15 causes a varying signal, such as a varying amplitude signal or a varying frequency signal, to be applied or induced on the pairs of input electrodes 16(1)16(2) and 18(1)–18(2) or 16(1)–16(2) which is transmitted out as an outgoing signal via the input leads 52 or across the input leads 52(1) and 52(2). Accordingly, these resonators 10(1)–10(9) can be used to eliminate the need for some components, such as separate transmit/receive cell phone boards.

By way of example only, an embedded charge density of 1e12 charges per $cm^2$ on the member and an oscillation sufficient to change the induced charge on an output set of electrodes by 1% will cause a voltage swing of 0.36 V. A 1% change in induced charge for a 6e12 charges per cm case yields an output swing of 2.16 V. Thus an average oscillation displacement of only a few tens of angstroms yields a significant output signal. These calculations are based on a percentage change in the magnitude of the induced charge on the output capacitor based on the relative position of the embedded charge 15 residing in the member 14(1) or 14(2).

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefor, is not intended to limit the claimed processes to any order except as may be specified in the claims. Accordingly, the invention is limited only by the following claims and equivalents thereto.

What is claimed is:

1. A resonator comprising:
 a member with an embedded charge;
 at least one input electrode;
 at least one output electrode; and
 at least one common electrode, the at least one input and output electrodes are spaced from and on substantially opposing sides of the member from the at least one common electrode, wherein at least one of the member and the input and output electrodes is movable with respect to the other.

2. The resonator as set forth in claim 1 further comprising an input lead coupled to the at least one input electrode, an output lead coupled to the at least one output electrode, and a common reference coupled to the common electrode.

3. The resonator as set forth in claim 1 wherein the at least one common electrode comprises a substrate comprising a conductive material.

4. The resonator as set forth in claim 1 wherein the member is movable with respect to the input and output electrodes.

5. The resonator as set forth in claim 1 wherein the input and output electrodes are movable with respect to the member.

6. The resonator as set forth in claim 1 further comprising a chamber, wherein at least one portion of the member is connected to the chamber and the member extends at least partially across the chamber.

7. The resonator as set forth in claim 6 wherein the member is connected on at least substantially opposing sides of the chamber.

8. The resonator as set forth in claim 6 wherein the member is fixed.

9. The resonator as set forth in claim 6 wherein the member has at least one elongated side and at least one end, wherein the member is connected to the chamber along the at least one elongated side.

10. The resonator as set forth in claim 6 wherein the member has at least one elongated side and at least one end, wherein the member is connected to the chamber at the at least one end.

11. The resonator as set forth in claim 6 wherein the member has at least one pair of opposing surfaces, wherein at least one of the opposing surfaces is fixed with respect to the chamber.

12. The resonator as set forth in claim 1 wherein the member is at least one of a single dielectric layer, a composite of two or more dielectric layers, a floating conductor, and an electret.

13. The resonator as set forth in claim 1 wherein the member is made from one or more materials selected from a group consisting of silicon oxide, silicon dioxide, silicon nitride, aluminum oxide, tantalum oxide, tantalum pentoxide, titanium oxide, titanium dioxide, barium strontium titanium oxide.

14. The resonator as set forth in claim 1 wherein the at least one common electrode comprises a corresponding input electrode for each of the at least one input electrode and a corresponding output electrode for each of the at least one output electrode.

15. The resonator as set forth in claim 14 wherein the at least one input electrode and the corresponding input electrode have a substantially circular shape and the at least one output electrode and the corresponding output electrode are arranged in a substantially annulus fashion around and spaced from the at least one input electrode and the corresponding input electrode.

16. The resonator as set forth in claim 14 wherein the at least one output electrode and the corresponding output electrode have a substantially circular shape and the at least one input electrode and the corresponding input electrode are arranged in a substantially annulus fashion around and spaced from the at least one output electrode and the corresponding output electrode.

17. The resonator as set forth in claim 14 further comprising at least two of the input electrodes, each of the at least two input electrodes having one of the corresponding input electrodes spaced from and on a substantially opposing side of the member, an input lead coupled to one of the two input electrodes and the one of the corresponding input electrodes for the one of the two input electrode, a tuning bias input coupled to the other of the two input electrodes and the other one of the corresponding input electrodes for the other one of the two input electrode, and an output lead coupled to the at least one output electrode and the corresponding output electrode.

18. The resonator as set forth in claim 14 further comprising at least two of the input electrodes, each of the at least two input electrodes having one of the corresponding input electrodes spaced from and on a substantially opposing side of the member, input leads coupled to each of the at least two input electrodes, an output lead coupled to the at least one output electrode, and a common reference lead coupled to the corresponding input electrodes and the corresponding output electrode.

19. A method for making a resonator, the method comprising:
providing a member with an embedded charge;
providing at least one input electrode;
providing at least one output electrode; and
providing at least one common electrode, the at least one input and output electrodes are spaced from and on substantially opposing sides of the member from the at least one common electrode, wherein at least one of the member and the input and output electrodes are movable with respect to the other.

20. The method as set forth in claim 19 wherein the providing at least one common electrode further comprises providing a corresponding input electrode for each of the at least one input electrode and a corresponding output electrode for each of the at least one output electrode.

21. The method as set forth in claim 19 wherein the member is movable with respect to the input and output electrodes.

22. The resonator as set forth in claim 19 wherein the input and output electrodes are movable with respect to the member.

23. The method as set forth in claim 19 further comprising providing a chamber, wherein at least one portion of the member is connected to the chamber and the member extends at least partially across the chamber.

24. The method as set forth in claim 23 wherein the member is connected on at least substantially opposing sides of the chamber.

25. The method as set forth in claim 23 wherein the member is fixed.

26. The method as set forth in claim 23 wherein the member has at least one elongated side and at least one end, wherein the member is connected to the chamber along the at least one elongated side.

27. The method as set forth in claim 23 wherein the member has at least one elongated side and at least one end, wherein the member is connected to the chamber at the at least one end.

28. The method as set forth in claim 23 wherein the member has at least one pair of opposing surfaces, wherein at least one of the opposing surfaces is fixed with respect to the chamber.

29. The method as set forth in claim 23 wherein the providing a chamber further comprises:
providing a first insulating layer;
providing a second insulating layer over at least a portion of the first insulating layer;
etching a first trench in second insulating layer which extends to the first insulating layer;
filling at least a portion of the first trench with a first sacrificial material, wherein the providing a member is on at least a portion of the first layer of sacrificial material and on at least a portion of the second insulating layer;
depositing a third insulating layer over at least a portion of the member;
etching a second trench in third insulating layer which extends to the member;
filling at least a portion of the second trench with a second layer of sacrificial material;
depositing a fourth insulating layer on at least a portion of the third insulating layer; and
removing the first and second layers of sacrificial material.

30. The method as set forth in claim 29 wherein the providing a member further comprises depositing the member on at least a portion of the first layer of sacrificial material and on at least a portion of the second insulating layer.

31. The method as set forth in claim 23 wherein the providing a chamber further comprises:
providing a first insulating layer;
providing a second insulating layer over at least a portion of the first insulating layer, wherein the providing a member is on at least a portion of the second insulating layer;
depositing a third insulating layer over at least a portion of the member;
etching a second trench in third insulating layer which extends to the member;
filling at least a portion of the second trench with a first layer of sacrificial material;
depositing a fourth insulating layer on at least a portion of the third insulating layer; and
removing the first layer of sacrificial material.

32. The method as set forth in claim 31 wherein the providing a member further comprises depositing the member on at least a portion of the second insulating layer.

33. The method as set forth in claim 19 wherein the member is at least one of a single dielectric layer, a composite of two or more dielectric layers, a floating conductor, and an electret.

34. The method as set forth in claim 19 wherein the member is made from one or more materials selected from a group consisting of silicon oxide, silicon dioxide, silicon nitride, aluminum oxide, tantalum oxide, tantalum pentoxide, titanium oxide, titanium dioxide, barium strontium titanium oxide.

35. The method as set forth in claim 19 wherein the at least one output electrode and the corresponding output electrode have a substantially circular shape and the at least one input electrode and the corresponding input electrode are arranged in a substantially annulus fashion around and spaced from the at least one output electrode and the corresponding output electrode.

36. The method as set forth in claim 19 wherein the at least one input electrode and the corresponding input electrode have a substantially circular shape and the at least one output electrode and the corresponding output electrode are arranged in a substantially annulus fashion around and spaced from the at least one input electrode and the corresponding input electrode.

37. The method as set forth in claim 19 wherein the providing a member further comprises storing the embedded charge in the member.

38. The method as set forth in claim 37 wherein the storing the embedded charge in the member comprises at least one of injecting electrons into the member, using ballistic injection to embed the charge, using polarization to embed the charge, and using high field injection to embed the charge.

39. The method as set forth in claim 19 wherein the providing at least one common electrode further comprises providing a first conducting layer to provide the at least one common electrode.

40. The method as set forth in claim 39 wherein the providing at least one common electrode further comprises etching the first conducting layer to form a corresponding input electrode for each of the at least one input electrode and to form a corresponding output electrode for each of the at least one output electrode.

41. The method as set forth in claim 39 wherein the providing the at least one input electrode and providing the at least one output electrode further comprises:

depositing a second conducting layer on at least a portion of the second layer of sacrificial material to provide the other one of the electrodes for at least one of the pairs of electrodes; and etching the second conducting layer to form the at least one input electrode and the at least one output electrode.

42. The method as set forth in claim 41 wherein the etching of the first conducting layer and the second conducting layer for the at least one output electrode and the corresponding output electrode each have a substantially circular shape and for the at least one input electrode and the corresponding input electrode a substantially annulus shape around the at least one output electrode and the corresponding output electrode with the substantially circular shape.

43. The method as set forth in claim 41 wherein the etching of the first conducting layer and the second conducting layer for the at least one input electrode and the corresponding input electrode each have a substantially circular shape and for the at least one output electrode and the corresponding output electrode a substantially annulus shape around the at least one input electrode and the corresponding input electrode with the substantially circular shape.

44. The method as set forth in claim 19 wherein the providing at least one common electrode further comprises providing a substrate comprising at least one conductive material, the substrate providing the at least one common electrode.

45. A method for passing a signal with a resonator, the method comprising:

receiving an input signal around a resonant frequency for the resonator;

applying a first varying signal on at least a first pair electrodes in response to the received input signal, each of the first pair of electrodes spaced from and on substantially opposing sides of a member with an embedded charge;

oscillating the member in response to the applied varying signal on the first pair of electrodes;

applying a second varying signal on at least a second pair electrodes in response to the oscillation of the member; and transmitting an output signal based on the applied second varying signal on the second pair of electrodes.

46. The method as set forth in claim 45 wherein the first varying signal comprises at least one of an amplitude modulated input signal and a frequency modulated input signal.

47. The method as set forth in claim 45 wherein the at least a first pair of electrodes and the at least a second pair of electrodes share a common electrode.

48. The method as set forth in claim 45 wherein the at least a first pair of electrodes and the at least a second pair of electrodes are separate sets of electrodes.

49. The method as set forth in claim 45 wherein the at least a first pair of input electrodes comprises at least two of the first pair of input electrodes.

50. The method as set forth in claim 49 further comprising applying a tuning bias to one of the at least two of the first pair of input electrodes.

51. A method for passing a signal with a resonator, the method comprising:

receiving an input signal around a resonant frequency for the resonator;

applying a first varying signal on at least a first pair electrodes in response to the received input signal, each of the first pair of electrodes spaced from and on substantially opposing sides of a member with an embedded charge;

oscillating one of the first pair of electrodes in response to the applied varying signal on the first pair of electrodes;

applying a second varying signal on at least a second pair electrodes in response to the oscillation of the one of the first pair of electrodes; and transmitting an output signal based on the applied second varying signal on the second pair of electrodes.

52. The method as set forth in claim 51 wherein the first varying signal comprises at least one of an amplitude modulated input signal and a frequency modulated input signal.

53. The method as set forth in claim 51 wherein the at least a first pair of electrodes and the at least a second pair of electrodes share a common electrode.

54. The method as set forth in claim 51 wherein the at least a first pair of electrodes and the at least a second pair of electrodes are separate sets of electrodes.

55. The method as set forth in claim 51 wherein the at least a first pair of input electrodes comprises at least two of the first pair of input electrodes.

56. The method as set forth in claim 55 further comprising applying a tuning bias to one of the at least two of the first pair of input electrodes.

* * * * *